US010186398B2

(12) United States Patent
Kiyohara et al.

(10) Patent No.: US 10,186,398 B2
(45) Date of Patent: Jan. 22, 2019

(54) SAMPLE POSITIONING METHOD AND CHARGED PARTICLE BEAM APPARATUS

(71) Applicant: HITACHI HIGH-TECH SCIENCE CORPORATION, Minato-ku, Tokyo (JP)

(72) Inventors: Masahiro Kiyohara, Tokyo (JP); Kengo Takeno, Tokyo (JP); Atsushi Uemoto, Tokyo (JP); Kaoru Umemura, Tokyo (JP)

(73) Assignee: HITACHI HIGH-TECH SCIENCE CORPORATION (JP)

( * ) Notice: Subject to any disclaimer, the term of this patent is extended or adjusted under 35 U.S.C. 154(b) by 0 days.

(21) Appl. No.: 15/279,096

(22) Filed: Sep. 28, 2016

(65) Prior Publication Data

US 2017/0092460 A1    Mar. 30, 2017

(30) Foreign Application Priority Data

Sep. 30, 2015    (JP) ................. 2015-192838

(51) Int. Cl.
*H01J 37/20* (2006.01)
*H01J 37/22* (2006.01)

(52) U.S. Cl.
CPC .............. *H01J 37/20* (2013.01); *H01J 37/22* (2013.01); *H01J 2237/20292* (2013.01)

(58) Field of Classification Search
CPC .......... H01J 37/00; H01J 37/02; H01J 37/023; H01J 37/2022; H01J 37/222; H01J 37/226

USPC ......................................... 250/306, 307, 311
See application file for complete search history.

(56) References Cited

U.S. PATENT DOCUMENTS

2008/0315120 A1* 12/2008 Albiez .................... H01J 37/20
250/491.1
2012/0328151 A1* 12/2012 Warschauer .......... H01J 37/222
382/103

FOREIGN PATENT DOCUMENTS

JP         4308639        10/1992
JP         2009525571      7/2009

* cited by examiner

*Primary Examiner* — Jason McCormack
(74) *Attorney, Agent, or Firm* — Adams & Wilks

(57) ABSTRACT

A sample positioning method that can easily and quickly position a target observation area of a sample, which is disposed on a sample stage in a sample chamber of a charged particle beam apparatus, into a field of view of a first charged particle beam. The method includes displaying an image including the sample on a display screen; designating an attention point on the basis of the image on the display screen while maintaining the relative position of the attention point with respect to the sample stage; aligning the position of the sample stage in the direction of an optical axis so that the attention point is positioned in an on-axis point tracer plane perpendicular to the optical axis through an on-axis target point on the optical axis; moving the attention point to the on-axis target point by performing detection of deviation of the attention point from the on-axis target point and movement in the on-axis point tracer plane; and moving the attention point into a depth of focus of a charged particle beam optics.

6 Claims, 21 Drawing Sheets

SAMPLE POSITIONING METHOD AND CHARGED PARTICLE BEAM APPARATUS

CROSS REFERENCE TO RELATED APPLICATION(S)

This application claims the benefit of Japanese Patent Application No. 2015-192838, filed Sep. 30, 2015, which is hereby incorporated by reference in its entirety into this application.

BACKGROUND OF THE INVENTION

1. Technical Field

The present invention relates to a sample positioning method and a charged particle beam apparatus.

2. Description of the Related Art

A charged particle beam is a general term for an ion beam and an electron beam. An apparatus that can perform any one of processing, observing, and analyzing (hereafter, referred to as 'observing etc.') using a focused beam of charged particles is called a charged particle beam apparatus. Such a charged particle beam apparatus is equipped with at least any one of an ion beam column for generating an ion beam and an electron beam column for generating an electron beam. Such a charged particle beam apparatus also includes a complex apparatus equipped with a plurality of columns.

In a charged particle beam apparatus, it is required to put an objective portion, that is, a portion to be observed, of a sample (hereafter, briefly referred to as a 'target observation area') in the field of view of a charged particle beam before observing the sample using a charged particle beam.

For example, an SEM (Scanning Electron Microscope) having an optical microscope for scanning an area to be observed of a sample has been disclosed in Patent Document 1.

A particle optical SEM (charged particle beam apparatus) that takes an image with a CCD camera by radiating a laser beam to a sample in a test chamber (sample chamber) and displays a mark showing the position of the axial line of a particle beam with the image of the sample in the test chamber on a display has been proposed in Patent Document 2. According to the particle optical SEM, an operator positions the sample while seeing the mark and the image of the sample on the display.

DOCUMENT OF RELATED ART (Patent Document 1) Japanese Patent Application Publication No. H. 4-308639
(Patent Document 2) Japanese Patent Application Publication No. 2009-525571

SUMMARY OF THE INVENTION

However, the sample positioning method and the charged particle beam apparatus in the related art have the following problems.

The target observation areas that a charged particle beam apparatus can observe are very small and are randomly distributed in a sample. Accordingly, it is difficult to consider all target observation areas to be observed as being in a field of view of a charged particle beam in one sample.

The field of view of a charged particle beam, for example, is about 1 µm×1 µm at high magnification and about 1 mm×1 mm at low magnification. The depth of a focus of a charged particle beam is about 1 mm at most.

On the other hand, scanning units that are used for positioning samples such as an optical microscope and a CCD camera generally have a field of view of about 100 mm×100 mm.

It is difficult to move target observation areas of a sample, which are distributed in a wide field of view, into the narrow field of view using a charged particle beam and it is accompanied by trials and errors, so it takes time to position a sample.

Even if there is provided in a mark showing the position of the axial line of a particle beam, as in the device disclosed in Patent Document 1, the images obtained by a CCD camera are 2D images obtained at an angle to the axial line of a particle beam and having a large depth of a focus. Accordingly, perspective is not easily observed, so that even if a target observation area is moved in a displayed image, it is difficult to find out the relationship with the actual movement direction. Therefore, the position of the axial line of a particle beam is not clearly shown, so operators have conventionally had to depend on their experience. As such, they cannot easily and quickly position samples.

In particular, in a charged particle beam apparatus having two or more charged particle beam columns, the target observation area of a sample must be moved to the point where the focuses of charged particle beams meet (a coincident point), so positioning is more difficult.

Accordingly, the present invention has been made keeping in mind the above problems occurring in the prior art, and an object of the present invention is to provide a sample positioning method and a charged particle beam apparatus that can easily and quickly position a target observation area of a sample into a field of view of a first charged particle beam in a sample chamber.

In order to accomplish the above object, a first aspect of the present invention provides a sample positioning method of positioning a target observation area of a sample, which is disposed on a sample stage in a sample chamber of a charged particle beam apparatus, into a field of view of a first charged particle beam radiated from an charged particle beam optics installed in a first charged particle beam column, the method including: displaying an image of the sample chamber having the sample on the sample stage therein in a display screen of a display unit; designating an attention point on the target observation area on the basis of the image in the display screen; aligning the sample stage in a direction of a first optical axis so that the attention point is positioned in an on-axis point tracer plane perpendicular to the first optical axis through an on-axis target point on the first optical axis of the first charged particle beam column; performing detection of deviation of the attention point from the on-axis point in the display screen and movement in the on-axis point tracer plane for moving the sample stage only in a direction perpendicular to the first optical axis, after positioning the attention point in the on-axis point tracer plane, and then moving the attention point to the on-axis target point; and moving the attention point into a depth of a focus of the charged particle beam optics by moving the sample stage along the first optical axis after moving the attention point to the on-axis target point.

The method may further include displaying sub-marks indicating the position of the on-axis target point and a position of the first optical axis in the display screen at least when moving the attention point to the on-axis target point to support movement of the attention point.

A second aspect of the present invention provides a charged particle beam apparatus including: a first charged particle beam column having a charged particle beam optics and radiating a first charged particle beam using the charged particle beam optics; a sample stage receiving a sample thereon and moving in a direction of a first optical axis of the first charged particle beam column and in a direction perpendicular to the first optical axis; a sample chamber receiving the sample stage; a chamber scope capturing an image of an inside of the sample chamber including the sample on the sample stage; a display unit displaying the image captured by the chamber scope; an attention point position control device receives input for designating an attention point on the image displayed in the display screen, and obtaining information about a position of the attention point in the display screen accompanying movement of the sample stage; a sample stage movement control device performing stage-positioning control for aligning the sample stage in a direction of a first optical axis of the first charged particle beam column so that the attention point is positioned on an on-axis point tracer plane perpendicular to the first optical axis through an on-axis target point on the first optical axis, movement control in an on-axis point tracer plane for moving the sample stage only in a direction perpendicular to the first optical axis, and on-axis movement control for moving the attention point into a depth of a focus of the charged particle beam optics by moving the sample stage along the first optical axis; a sub-mark display control device displaying a sub-mark indicating a position of the on-axis target point and a sub-mark indicating a position of the first optical axis; and a stage operator inputting operation instructions for the sample stage movement control device.

A third aspect of the present invention provides a charged particle beam apparatus including: a first charged particle beam column having an charged particle beam optics and radiating a first charged particle beam using the charged particle beam optics; a sample stage receiving a sample thereon and moving in a direction of a first optical axis of the first charged particle beam column and in a direction perpendicular to the first optical axis; a sample chamber receiving the sample stage; a chamber scope capturing an image of an inside of the sample chamber including the sample on the sample stage; a display unit displaying the image captured by the chamber scope; an attention point position control device receives input for designating an attention point on the image displayed in the display screen, and obtaining information about a position of the attention point in the display screen accompanying movement of the sample stage; a sample stage movement control device performing stage-positioning control for aligning the sample stage in a direction of a first optical axis of the first charged particle beam column so that the attention point is positioned on an on-axis point tracer plane perpendicular to the first optical axis through an on-axis target point on the first optical axis, movement control in an on-axis point tracer plane for moving the sample stage only in a direction perpendicular to the first optical axis, and on-axis movement control for moving the attention point into a depth of a focus of the charged particle beam optics by moving the sample stage along the first optical axis; and a positioning control device making the sample stage movement control device perform the stage positioning control, moving the attention point to the on-axis target point by making the sample stage movement control device perform the movement control in an on-axis point tracer plane on the basis of deviation of the attention point from the on-axis target point in the display screen, and making the sample stage movement control device perform the on-axis movement control after the attention point is moved to the on-axis target point.

The charged particle beam apparatus of the second or third aspect may further include: a secondary charged particle beam column radiating a secondary charged particle beam along a second optical axis intersecting the first optical axis of the first charged particle beam column and intersecting a capturing direction of the chamber scope; and an image generator capturing an image of the sample by radiating the secondary charged particle beam to the sample, in which the sample stage movement control device may adjust a position of the attention point in a field of view of the secondary charged particle beam column during the on-axis movement control.

According to the sample positioning method and apparatus of the present invention, it is possible to easily and quickly position a target observation area of a sample in a sample chamber into an observation field of view of a first charged particle beam.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
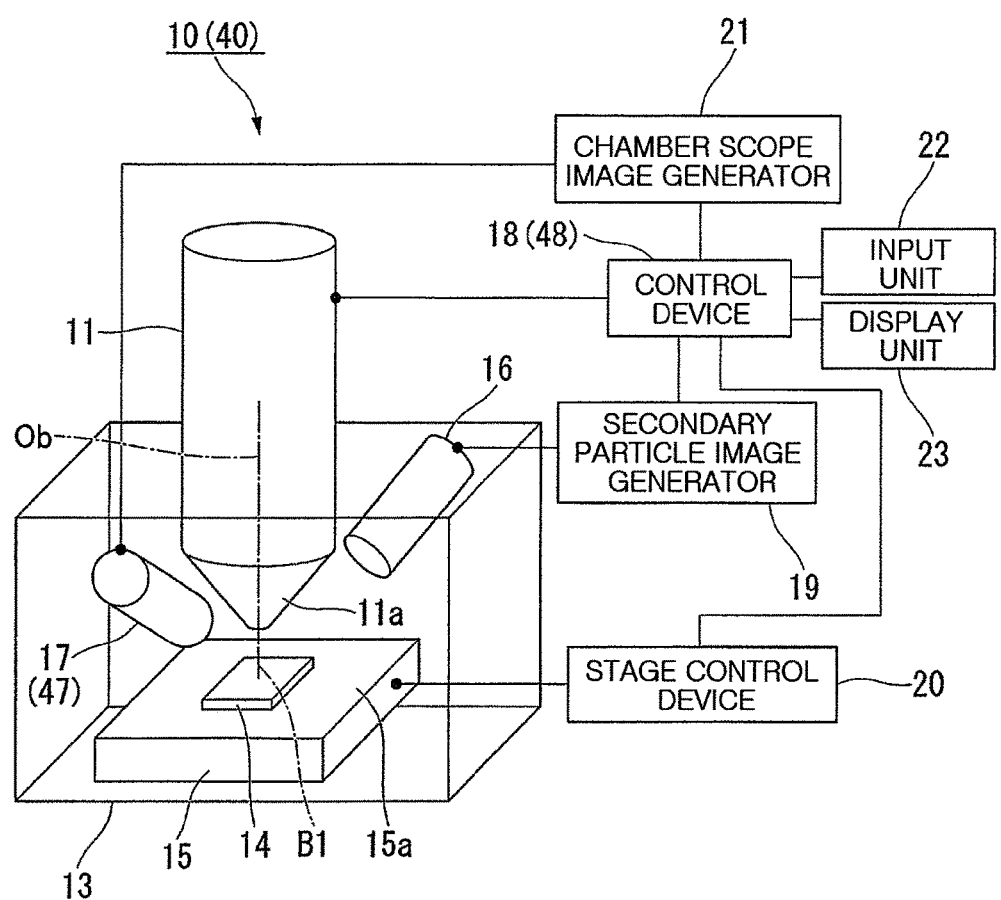
FIG. 1 is a schematic diagram showing the configuration of a charged particle beam apparatus according to a first embodiment of the present invention.

Hereinafter, embodiments of the present invention will be described in detail with reference to the accompanying drawings. In all drawings, even if there are different embodiments, the same reference numerals are given to the same or like components and common configurations are not described.

[First Embodiment]

A charged particle beam apparatus according to a first embodiment of the present invention is described.

FIG. 1 is a schematic diagram showing the configuration of a charged particle beam apparatus according to a first embodiment of the present invention. Since FIG. 1 is a schematic view, the shapes and sizes may be exaggerated (which is the same in the other figures to be described below).

A charged particle beam apparatus 10 according to an embodiment shown in FIG. 1, performs any one of processing, observation, and analysis of a sample 14 by radiating a focused first charged particle beam B1 (hereafter, a first charged particle beam) to the sample 14. The charged particle beam apparatus 10 may be, for example, a focused ion beam apparatus or a scanning electron microscope.

When the charged particle beam apparatus 10 is an apparatus for processing, if necessary, it may have at least any one of an etching-gas supplier or a deposition-gas supplier, which are not shown in the figures.

The first charged particle beam B1 is any one of an ion beam or an electron beam, depending on the use of the charged particle beam apparatus 10.

The charged particle beam apparatus 10 needs to perform scanning and sweeping of objective parts of the sample 14, using the first charged particle beam B1, regardless of processing, observation, and analysis. In the charged particle beam apparatus 10, the area that is scanned by the first charged particle beam B1 is called a field of view of the first charged particle beam B1.

Parts of the sample 14 to which the operations of the charged particle beam apparatus 10, including even processing to be described below, are applied are called target observation areas.

The charged particle beam apparatus 10 includes a charged particle beam column 11 (first charged particle beam column), a sample chamber 13, a sample stage 15, a secondary particle detector 16, a chamber scope 17, a secondary particle image generator 19, a stage control device 20, a chamber scope image generator 21, an input unit 22 (a stage operator), a display unit 23, and a control device 18 (an attention point designation control device, sample stage movement control device, and a sub-mark display control device).

The sample chamber 13 receives the sample 14 to which any one of processing, observation, and analysis is applied by the charged particle beam apparatus 10. A vacuum exhauster (not shown) for maintaining or changing the degree of a vacuum inside the sample chamber 13 is connected to the sample chamber 13.

The sample stage 15 that supports and moves the sample 14 is disposed in the sample chamber 13. The charged particle beam column 11 for radiating the first charged particle beam B1 toward the sample stage 15 is disposed over the sample stage 15. The charged particle beam column 11 is vertically disposed in this embodiment.

The sample stage 15 has a bed surface 15a on the top for placing the sample 14. The outer shape of the bed surface 15a is not specifically limited, but is, for example, a rectangle when seen from above in this embodiment.

The sample stage 15 is a five-axis moving part formed by a combination of an XYZ-axis stage, a tilting stage, and a rotary stage (which are not shown in the figures).

The XYZ-axis stage moves the bed surface 15a in the directions of two axes of an X axis and a Y axis, which are perpendicular to each other in a plane, and in the direction of a Z axis parallel with the vertical axis. The tilting stage moves the bed surface 15a at an angle around the X axis or the Y axis. The rotary stage rotates the bed surface 15a about the Z axis.

The sample stage 15 is connected to the stage control device 20 to be described below such that they can communicate with each other.

The stage control device 20 is connected to the control device 18 to be described below such that they can communicate with each other, and controls the operation of the sample stage 15 in response to instructions from the control device 18.

The charged particle beam column 11 generates the first charged particle beam B1 and radiates the first charged particle beam B1 to the sample 14 on the sample stage 15.

The charged particle beam column 11 has a charged particle beam source and a charged particle optics including a lens electrode, which focuses the charged particles from the charged particle beam source, and a deflection electrode which deflect the charged particles. However, the internal structure is well known in the art is not shown in FIG. 1.

In the charged particle beam column 11, radiation positions and radiation conditions of focused charged particles for the charged particle source and the charged particle optics are controlled in response to control signals from the control device 18 to be described below.

The charged particle beam source is, for example, a liquid metal ion source using liquid gallium, a plasma type ion source, a gas field ion source, or a field emission electron source.

The charged particle beam column 11 is disposed over the sample stage 15 such that the optical axis Ob of the charged particle optics is parallel with the vertical axis.

The optical axis Ob for the charged particle beam column 11 is the same as the Z axis for the sample stage 15.

In the charged particle beam column 11, the deflection electrode deflects the first charged particle beam B1 in two deflection directions that are perpendicular to each other and perpendicular to the optical axis Ob. Accordingly, the charged particle beam column 11 can scan and sweep a rectangular area having a predetermined size on a focus surface of the charged particle optics with the first charged particle beam B1. The rectangular area that can be swept by the first charged particle beam B1, which is a range where an image can be obtained by radiating the first charged particle beam B1, constitutes the field of view that is formed by the radiation of the first charged particle beam B1.

The field of view of the charged particle beam column 11 depends on magnification determined by the control device 18. The field of view of the charged particle beam column 11, for example, is about 1 μm×1 μm at high magnification and about 1 mm×1 mm at low magnification.

The chamber scope 17 captures an image of the inside of the sample chamber 13, including at least the sample 14 on the bed surface 15a, to observe or monitor the situation and the sample 14 inside the sample chamber 13.

For example, a CCD camera or an optical microscope that can capture images using visible light or infrared light may be used for the chamber scope 17.

When a CCD camera using visible light is used for the chamber scope 17, the illumination light of visible light has an advert influence on the detecting operation of the secondary particle detector 16 to be described below, so it is impossible to perform observation using the first charged particle beam B1 when using the chamber scope 17.

However, this problem can be removed by using, as the chamber scope 17 an infrared CCD camera that detects infrared wavelengths. Further, the infrared CCD camera can visualize object in the darkness, so it is possible to see movement of a target observation area using the chamber scope 17 by radiating the first charged particle beam B1 to the sample 14 without radiating visual light inside the sample chamber 13.

Accordingly, as will be described below, it is possible to immediately move a target observation area into the field of view by the first charged particle beam B1 after moving the target observation area on the optical axis Ob of the charged particle beam column 11.

The field of view of the chamber scope 17 can be determined in desired sizes, depending on the purpose of observation or monitoring. The field of view of the chamber scope 17 for positioning the sample 14 may be determined such that it is possible to obtain an image including the entire sample 14 outside of the field of view of the charged particle beam column 11 and the field of view of the charged particle beam column 11. The field of view of the chamber scope 17 for positioning the sample 14 depends on the installation position of the chamber scope 17, the distance from the sample, and necessary magnification, and for example may be about 100 mm×100 mm. The chamber scope 17 may have a zoom optics to be able to change the size of the field of view.

The chamber scopes 17 capture images at an angle toward the bed surface 15a from over the sample stage 15. The relationship between the capturing direction of the chamber scope 17 and the optical axis Ob of the charged particle beam column 11 is described with reference to FIG. 2.

Figure 2:
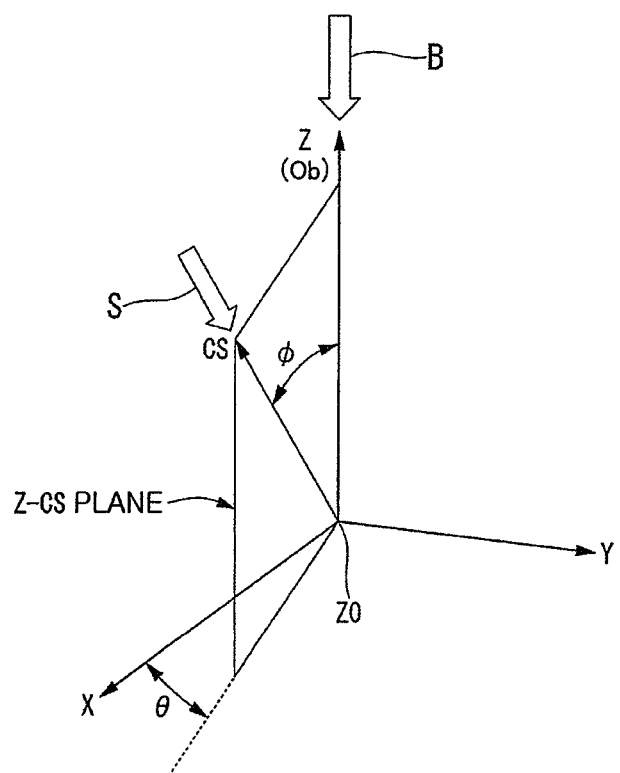
FIG. 2 is a schematic diagram showing a coordinate system in the charged particle beam apparatus according to the first embodiment of the present invention.

FIG. 2 is a schematic diagram showing a coordinate system in the charged particle beam apparatus according to the first embodiment of the present invention.

Referring to FIG. 2, an XYZ coordinate system is composed of an X axis, a Y axis, and a Z axis that are movement axes of the sample stage 15. As described above, Z axis is the same as the optical axis Ob of the charged particle beam column 11.

The origin Z0 in the XYZ coordinate system is the intersection of the bed surface 15a and the optical axis Ob in the initial state of the bed surface 15a with the sample 14 thereon. In this embodiment, the origin Z0 is a Z-axial reference position of the sample stage 15 when a sample is put into and taken out of the sample camber 13. The origin Z0 is hereafter referred to as a reference point Z0.

The capturing direction S of the chamber scope 17 is determined toward the reference Z0 along an axial line (hereafter, referred to as a chamber scope (CS) axis) obtained by turning the Z axis at an angle φ around Y axis and then turning it at an angle θ around the initial Z axis. The forward direction of the CS axis faces the chamber scope 17 from the reference point Z0. The CS axis is an optical capturing axis of the chamber scope 17.

Hereafter, the plane having the X axis and Y axis is referred to as an X-Y plane and the plane having Z axis and the CS axis is referred to as a Z-CS plane.

As shown in FIG. 1, the chamber scope image generator 21 is connected to the chamber scope 17 and the control device 18 such that they can communicate with each other.

The chamber scope image generator 21 creates frame image data from an image signal outputted from the chamber scope 17. The chamber scope image generator 21 sequentially transmits the created frame image data to the control device 18.

The secondary particle detector 16 detects the intensity of secondary charged particles (secondary electrons and secondary ions) emitted from a radiation object (that is, the amount of secondary charged particles) when the first charged particle beam B1 is radiated, and outputs the information about the amount of detected secondary charged particles. The secondary particle detector 16 is disposed at a position in the sample chamber 13 where secondary charged particles can be detected such that an image of a radiation object can be obtained.

The secondary particle detector 16 is connected to the secondary particle image generator 19 to be described below such that they can communicate with each other. The secondary particle detector 16 transmits the detection result to the secondary particle image generator 19.

The secondary particle image generator 19 is connected to the secondary particle detector 16 and the control device 18 to be described below such that they can communicate with each other.

The secondary particle image generator 19 converts the amount of detected secondary charged particles transmitted from the secondary particle detector 16 into a luminance signal corresponding to the irradiated position. Image data showing the shape of the radiation object is created on the basis of the two-dimensional distribution of the amount of detected secondary charge particles.

The secondary particle image generator 19 transmits the created frame image data to the control device 18.

The display unit 23 is connected to the control device 18 to be described below such that they can communicate with each other. The display unit 23 displays images based on the image information from the control device 18.

The image information from the control device 18 to be describe above includes an image based on image data from the chamber scope image generator 21 and image data from the secondary particle image generator 19.

As examples of other images that the display unit 23 displays, there may be the images of various sub-marks created by the control device 18 to be described below, the image of a mark showing an attention point, an input display screen, and an operation state display screen.

The display unit 23 has a touch panel for inputting by touching the display display screen.

The input unit 22 is a part for an operator to input operations to the charged particle beam apparatus 10. The input unit 22 may be, for example, a well-known input device such as a mouse and a keyboard. The input unit 22 is connected to the control device 18 such that they can communicate with each other.

When an operation input display screen including a GUI is displayed on the display unit 23, operations can be inputted through the operation input display screen.

The control device 18 controls operations of the parts of the charged particle beam apparatus 10. Accordingly, the control device 18 is connected with the charged particle beam column 11, the sample stage 15, the chamber scope image generator 21, the secondary particle image generator 19, the input unit 22, and the display unit 23 to be able to communicate with them.

The control device 18 generally controls the operation of the charged particle beam apparatus 10 in response to signals inputted through the input unit 22 or signals created by a predetermined automatic operation control process.

When the charged particle beam apparatus 10 includes an etching gas supplier and a deposition gas supplier that are not shown in the figures, the control device 18 also controls these suppliers.

For example, the control device 18 controls scanning and sweeping by the first charged particle beam B1 from the charged particle beam column 11.

For example, when the first charged particle beam B1 is radiated to the sample 14, the control device 18 transmits a control signal to the secondary particle image generator 19 and acquires an image based on the detection output from the secondary particle detector 16. When image data is transmitted out of the secondary particle image generator 19, the control device 18 displays an image corresponding to the image data on the display unit 23.

For example, the control device 18 creates an instruction to operate the sample stage 15 and transmits the instruction to the stage control device 20 in response to input through the input unit 22 or a signal created by the predetermined automatic operation control process.

For example, the control device 18 transmits frame image data from the chamber scope image generator 21 to the display unit 23 so that the display unit 23 displays a corresponding image. The image that is displayed on the display unit 23 on the basis of frame image data from the chamber scope image generator 21 is hereafter referred to as a CS image.

The control device 18 creates images of various sub-marks and an image of a mark indicating an attention point on the basis of input through the input unit 22 or a signal created by the predetermined automatic operation control process, when displaying a CS image on the display unit 23.

The created images of marks are shown in the CS image on the display unit 23.

The sub-marks and the mark indicating an attention point will be described in relation to operations to be described below.

For example, control device 18 creates and displays an operation input display screen including an appropriate GUI on the display unit 23 so that a user can input operation through the input unit 22 or by touching the display unit 23 when the display unit 23 includes a touch panel.

Other control by the control device 18 will be described in relation to operations in the sample positioning method based on this embodiment using the charged particle beam apparatus 10.

The mechanical configuration of the control device 18 is constituted by a computer including a CPU, a memory, an I/O interface, and an external memory, and accordingly, it executes a control program for creating control signals for performing the functions described above.

Next, in the operation of the charged particle beam apparatus 10, the operation relating to the sample positioning method of this embodiment is mainly described.

According to the sample positioning method of this embodiment using the charged particle beam apparatus 10, an operator moves the sample stage 15 with a CS image displayed on the display unit 23. Some of the operations of the sample stage 15 may be automatically performed by the charged particle beam apparatus 10.

The charged particle beam apparatus 10 has, as modes for positioning a sample, a manual operation mode for performing main operations in response to input from an operator and a positioning support mode in which some operations are automated The manual operation mode and the positioning support mode are switched by input through the input unit 22 from an operator.

Hereafter, the operations in the positioning support mode will be mainly described. As for the operations in the manual operation mode, the operations of the control device 18 can be appropriately changed to the operations performed by an operator through the input unit 22.

First, display screens displayed by the display unit 23 in the charged particle beam apparatus 10 are described.

Figure 3:
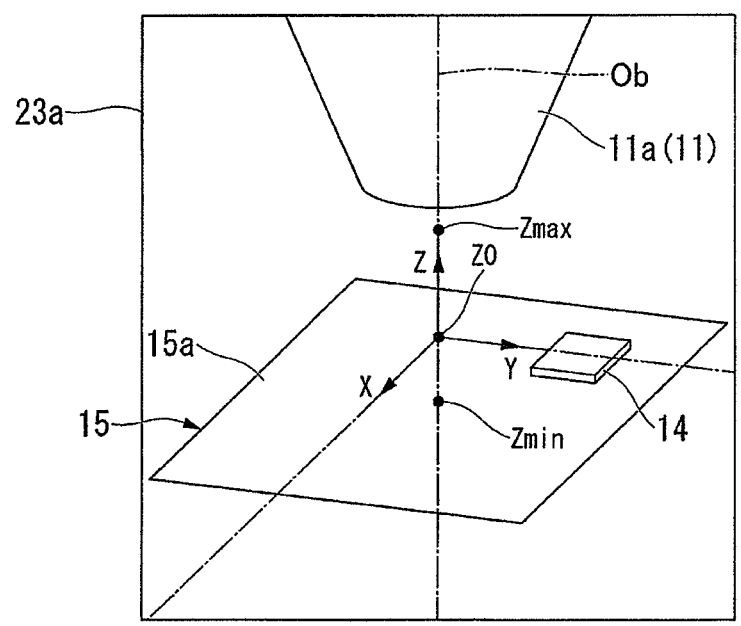
FIG. 3 is a schematic diagram showing an example of the display screen of a display unit showing a CS image.
Figure 4:
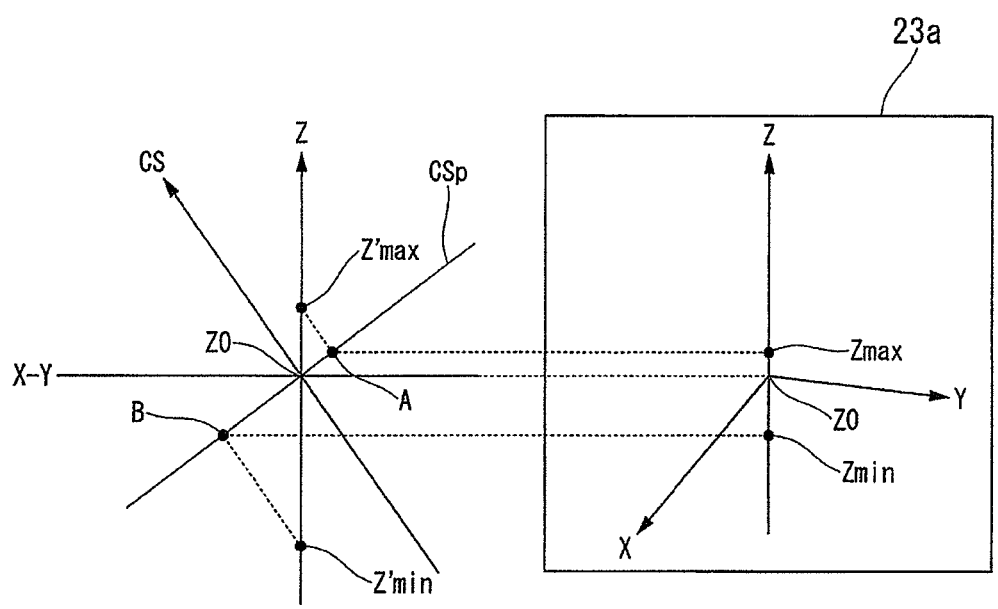
FIG. 4 is a schematic diagram showing the relationship between an XYZ coordinate system in a sample chamber and an XYZ coordinate system projected to a display screen.

FIG. 3 is a schematic diagram showing an example of the display screen of a display unit showing a CS image. FIG. 4 is a schematic diagram showing the relationships between an XYZ coordinate system in an example chamber and an XYZ coordinate system projected to a display screen.

The display screen 23a shown in FIG. 3 is a display screen that shows a CS image on the display unit 23. The display screen 23a is displayed on the entire display unit 23, but it may be displayed in a part on the display unit 23. When the display screen 23a is displayed in a part on the display unit 23, for example, an operation input display screen may be displayed in the other area on the display unit 23.

In the display screen 23a, as an example of a CS image, an objective lens electrode 11a at the lower end of the charged particle beam column 11, the bed surface 15a of the sample stage 15, and the sample 14 on the bed surface 15a are shown. However, in FIG. 3, the XYZ coordinate system and dashed dotted lines extending along the axes are provided for reference for description and are not actually shown in the display screen 23a.

Referring to FIG. 3, the bed surface 15a is in the X-Y plane passing the reference point Z0. The sample 14 is disposed at the positive side on the Y axis on the bed surface 15a.

In FIG. 3, a point Zmax is positioned at the positive side on Z axis from the reference point Z0. The point Zmax on the Z axis is a top limit position of the bed surface 15a at the positive side of the Z axis. The position of the point Zmax is determined such that the bed surface 15a does not collide with the objective lens electrode 11a even if there is an error, but the sample 14 on the bed surface 15a may collide with the objective lens electrode 11a, depending on the height of the sample 14. The point Zmax is referred to as a top limit point Zmax.

In FIG. 3, a point Zmin on the Z axis is positioned at the negative side on Z axis from the reference point Z0. The point Zmin is a bottom limit position of the bed surface 15a at the negative side of the Z axis in the sample positioning method of this embodiment. That is, in the sample positioning method of this embodiment to be described below, the bed surface cannot be moved lower than the Zmin on the Z axis. Accordingly, the point Zmin is referred to as a bottom limit point Zmin in the following description.

The top limit point Zmax and the bottom limit position Zmin may be mechanical movement limits of a stage on the Z axis or may be software movement limits determined by instructions from the control device 18.

A CS image that is displayed in the display screen 23a is an image that is obtained when the reference point Z0 is seen in the direction of the CS axis inclined with respect to the X axis, Y axis, and Z axis. The CS image is obtained by overlooking the bed surface 15a at an angle. The center of the CS image in the display screen 23a is the reference point Z0.

FIG. 4 shows the relationship between the XYZ coordinate system (at the right side) in the display screen 23a and the axes (at the left side) protected on the Z-CS plane.

A CS image is a two-dimensional image obtained by projecting a three-dimensional image in the field of view of the chamber scope 17 to a projective plane CSp (see the diagram at the left side in FIG. 4) that is a plane perpendicular to the CS axis through the reference point Z0.

For example, the top limit point Zmax and the bottom limit point Zmin on a CS image, as shown at the left side in FIG. 4, correspond to points A and B orthogonally projected on the projective plane CSp from points Z'max and Z'min on Z axis in the three-dimensional space. Accordingly, the lines Z0-Zmax and Z0-Zmin on the CS image are shorter than the corresponding lines Z0-Z'max and Z0-Z'min in the three-dimensional space under the same magnification.

As described above, the distances between points at each part on the CS image are different from the actual distances in the three-dimensional space, so the CS image is distorted by the inclination of the CS axis. Accordingly, it is difficult for an operator to intuitively find out the actual distances between points on the CS image.

Further, X-axial movement and Y-axial movement of the sample stage 15 are made at an angle in the display screen 23a, so an operator has difficulty in finding out the relationship among the movement components and directions of the sample stage 15 on the axes only by seeing the CS image.

According to the sample positioning method of this embodiment, it is possible to more efficiently position target observation areas of the sample 14 on the bed surface 15a into the observation field of view of the first charged particle beam B1 in consideration of the characteristics of the CS image.

The sample positioning method of this embodiment using the charged particle beam apparatus 10 is described with reference to FIGS. 5 to 14.

Figure 5:
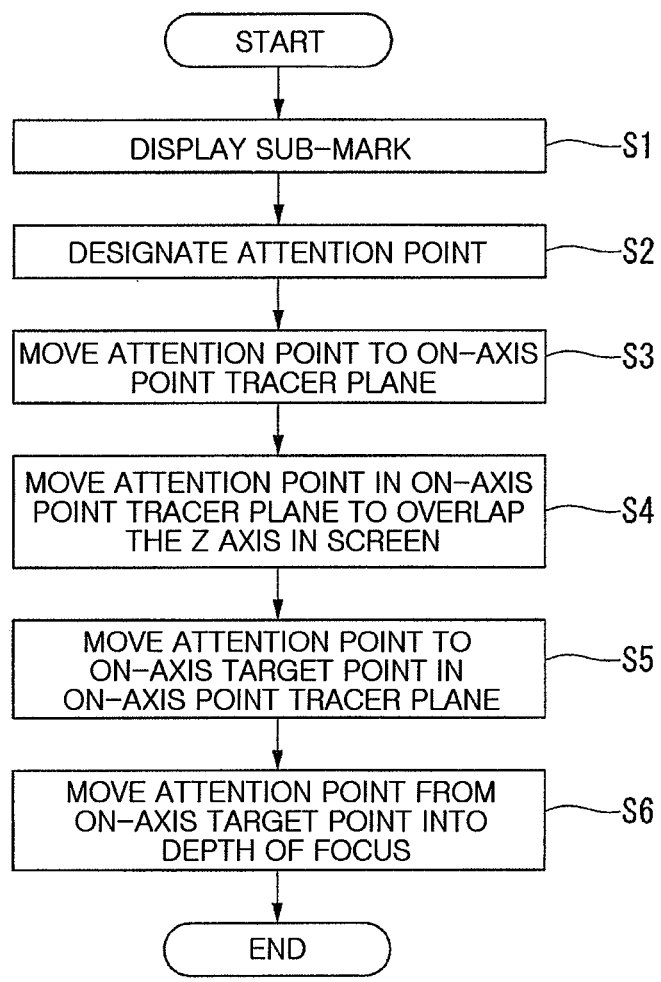
FIG. 5 is a flowchart illustrating the operation of a sample positioning method according to a first embodiment of the present invention.

FIG. 5 is a flowchart illustrating the operation of a sample positioning method according to an embodiment of the present invention.

The sample positioning method of this embodiment performs steps S1 to S7 shown in FIG. 5 in accordance with the flow show in FIG. 5.

First, an operator stops operations by operating the input unit 22, if there are operations, which have been performed, of the charged particle beam apparatus 10. The operator displays a CS image in the display screen 23a of the display unit 23, when a CS image is not displayed on the display unit 23.

Thereafter, the operator performs input for executing the positioning support mode through the input unit 22.

Hereafter, a case when the sample 14 is sufficiently thin and a target observation area and the bed surface 15a are actually in the same plane is exemplified for simple description, and the operation when the sample 14 is thick will be described later.

First, step S1 in FIG. 5 is performed. Step S1 is a process of showing a sub-mark in the display screen 23a.

Figure 6:
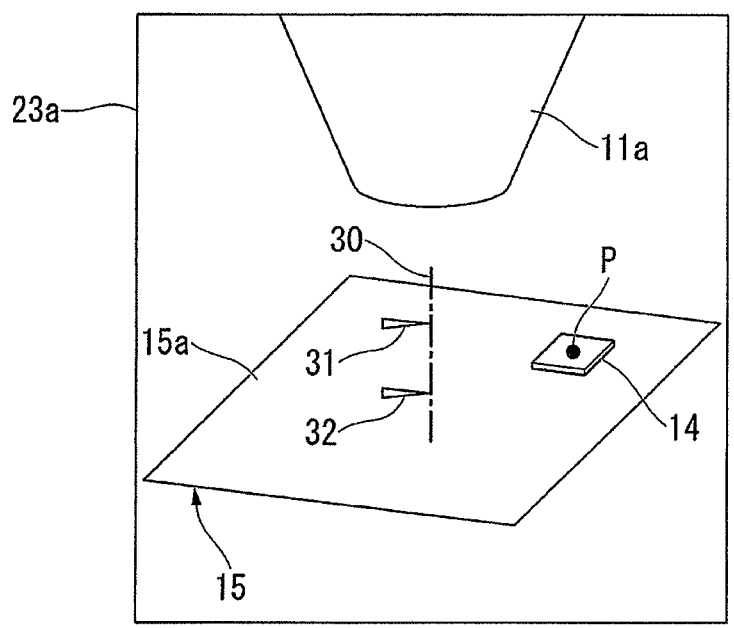
FIG. 6 is a schematic diagram showing a display screen after steps S1 and S2 are performed in FIG. 5.

FIG. 6 is a schematic diagram showing a display screen after steps S1 and S2 are performed in FIG. 5.

The control device 18, as shown in FIG. 6, creates images of an optical axis mark 30, a reference point mark 31, and a bottom limit point mark 32 as sub-marks and transmits the marks to the display unit 23. The display unit 23 displays the optical axis mark 30, the reference point mark 31, and the bottom limit point mark 32 on the CS image.

These sub-marks are just examples. Appropriate marks that can support positioning may be used as the sub-marks. Sub-marks may be added after this step, if necessary, or may not be displayed in this step.

In particular, in the manual operation mode, sub-marks can be displayed on a CS image, if necessary, by the operator.

The optical axis mark 30 is a straight line indicating the optical axis Ob of the charged particle beam column 11. In this embodiment, the optical axis mark 30 is the Z axis in the CS image. The optical axis mark 30 is expressed as a line passing through the top limit point Zmax and the bottom limit point Zmin not shown in FIG. 6.

In the capturing direction of the chamber scope 17 in this embodiment, the optical axis mark 30, for example, may be a vertical axial line passing though the center of the display screen 23a.

The reference point mark 31 is a sub-mark indicating a Z-axial reference position (reference point Z0) of the sample stage 15 for putting and taking a sample into and out of the sample chamber 13. The shape of the reference point mark 31 is not limited, but in FIG. 6, it is a thin triangle horizontally extending in the display screen, in which the point being in contact with the optical axis mark 30 indicates the position of the reference point Z0 on the CS image.

The bottom limit point mark 32 indicates the position of the bed surface 15a (the bottom limit point Zmin) on the Z axis when the sample stage 15 has been moved down to the bottom limit in the Z-axial direction. The bottom limit point mark 32 is a thin and long triangle the same as the reference point mark 31.

The main principle of the sample positioning method of this embodiment is described hereafter.

According to the sample positioning method of this embodiment, a target observation area is moved into the field of view of a charged particle beam by moving the target observation area on the actual Z axis and then moving the sample stage 15 in the Z-axial direction.

The fact that the target observation area is positioned on the actual Z axis means that the target observation area is positioned on the optical axis Ob that coincides with Z axis, so it is positioned at the center of the field of view formed by radiating the first charged particle beam B1.

On the other hand, points in the Z-CS plane of a CS image are all on the straight line indicating the Z axis on the CS image. Accordingly, it is impossible to make sure that a target observation area is on the Z axis only by seeing the display screen 23a and moving the target observation area on a line extending from the optical axis mark 30 on the CS image.

In this embodiment, a target observation area is moved onto the Z axis by moving the sample stage 15 only in the X-axial direction of the Y-axial direction. Planes that are parallel to the X-Y plane intersect the Z axis only at one point. The bottom limit point Zmin is addressed as a representative point where the X-Y plane intersects the Z axis herein. Further, if there is a point on the sample 14 that moves on the X-Y plane passing the bottom limit point Zmin and overlaps the bottom limit point Zmin on the CS image, it is an on-axis point on the actual Z axis.

In this embodiment, in order to make sure of moving a target observation area onto the optical axis Ob, the movement of an target observation area is limited to one plane (referred to as an on-axis point tracer plane) perpendicular to the optical axis Ob. Movement of a target observation area in an on-axis point tracer plane is referred to as movement in an on-axis point tracer plane.

In movement in an on-axis point tracer plane, an on-axis target point to which a target observation area is supposed to move in the display screen 23a is an intersection between the on-axis point tracer plane and the optical axis Ob.

In this embodiment, the on-axis target point is an intersection between the on-axis point tracer plane, which is one plane parallel with the X-Y plane, and Z axis.

The on-axis point tracer plane can be somewhat freely determined as long as it is a plane parallel with the X-Y plane. However, depending on the size of the sample 14, the sample 14 may collide with the objective lens electrode 11a during movement in an on-axis point tracer plane when the plane intersects the Z axis at a too high position. Accordingly, it is preferable to determine a plane that is positioned as away as possible under the objective lens electrode 11a as the on-axis point tracer plane.

In this embodiment, the bottom limit point Zmin of the bed surface 15a of the sample stage 15 is determined in advance in consideration of this problem, and the bed surface 15a is supposed to move in a plane parallel with the X-Y plane through the bottom limit point Zmin during movement in on-axis point tracer plane. In this case, the on-axis point tracer plane is a plane obtained by moving the plane, in which the bed surface 15a is moved, as much as the thickness of the sample 14 in the positive direction of the Z axis.

When it is possible to ignore the thickness of the sample 14, the on-axis point tracer plane is the plane passing the bottom limit point Zmin of planes that are parallel with the X-Y plane. Accordingly, the on-axis target point is positioned at the bottom limit point Zmin.

In this embodiment, the coordinates of the bottom limit point Zmin in the display screen 23a are stored as a default on-axis target point in the control device 18. In this embodiment, when the sample 14 is thick, an operator can input the thickness of the sample 14 into the control device 18 through the input unit 22. In this case, the control device 18 creates the coordinates of the on-axis target point by correcting the coordinates of the bottom limit point Zmin with the input thickness.

The positions of sub-marks depend on the installation position of the chamber scope 17, the observation angle (capturing direction S), and the magnification etc. For the positions of sub-marks, indication images are made on the basis of the observation angle of the chamber scope 7, the field of view, the position of the objective lens, and the amount of Z-axial movement of the sample stage 17 and then stored in the control device 18 in the process of manufacturing the charged particle beam apparatus 10.

The shapes of sub-marks described above are just examples. For example, a point image coinciding with a specific point, a circular, elliptical, and rectangular image surrounding a specific point, a polygonal image having a corner corresponding to a specific point, and an cross image having the intersection corresponding to a specific point may be used for the sub-marks indicating the positions of specific points such as the reference point mark 31 and the bottom limit point mark 32.

When all of sub-marks to be displayed are displayed, step S1 is finished.

As shown in FIG. 5, step S2 is performed after step S1. Step S2 is a process of designating an attention point.

An operator sees the sample 14 displayed on the CS image and designates the center point of a target observation area as an attention point P (see FIG. 6). The operator, for example, selects an image pixel at the center of a target observation area in the display screen 23a by clicking a mouse or moving a cursor using the input unit 22, thereby designating the attention point P. The coordinates of the pixel selected as the attention point P is stored in the control device 18. The address of the pixel may be used as the coordinates of the pixel in the display screen 23a.

Figure 7:
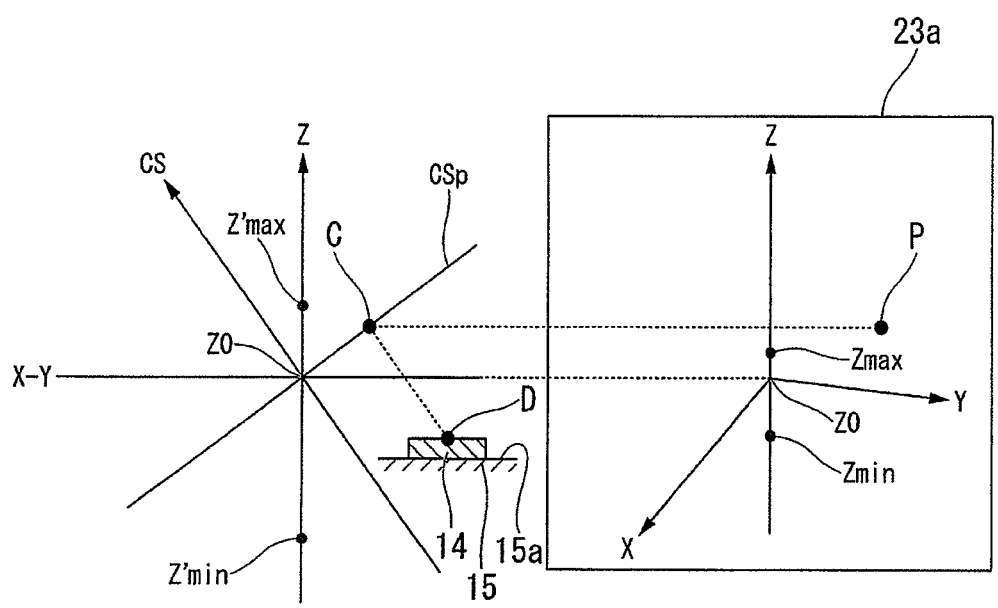
FIG. 7 is a schematic diagram showing the relationship between the position of an attention point and an XYZ coordinate system in FIG. 6.

The relationship between the attention point P and the XYZ coordinate system is schematically shown in FIG. 7, as in FIG. 4. FIG. 7 is a schematic diagram showing the relationship between the position of a target point and an XYZ coordinate system in FIG. 6.

As shown in FIG. 7, the attention point P is not on the Z axis in this case. This will be easily understood just by seeing the CS image in the display screen 23a.

After the attention point P is designated, the control device 18 may show an attention point mark (not shown) in the display screen 23a. The attention point mark is a sub-mark that makes the designated attention point P is easily recognized. The images indicating the positions of specific points described above may be used as the attention point mark.

The attention point mark may move in the display screen 23a with movement of the attention point P that accompanies movement of the sample stage 15. In this case, it is possible to prevent an operator from not seeing and losing the attention point P while moving the sample stage 15.

In order to move the attention point mark with the sample stage 15, the control device 18 obtains a movement vector of the attention point P in the three-dimensional space from the amount of movement of the sample stage 15. The control device 18 converts the movement vector into a movement vector in the display screen 23a by orthogonally projecting the movement vector to the projection plane CSp. The control device 18 obtains coordinates after movement by adding the movement vector to the coordinates in the display screen 23a stored when the attention point P is designated. The control device 18 transmits an image of the attention point mark based on the coordinates after movement to the display unit 23. Accordingly, the attention point mark after movement is displayed in the display screen 23a.

The attention point mark may be switched to be displayed or not by input from an operator through the input unit 22.

When the attention point P is designated and, if necessary, an attention point mark is displayed, step S2 is finished.

As shown in FIG. 5, step S3 is performed after step S2. Step S3 is a process of moving an attention point to an on-axis point tracer plane.

Figure 8:
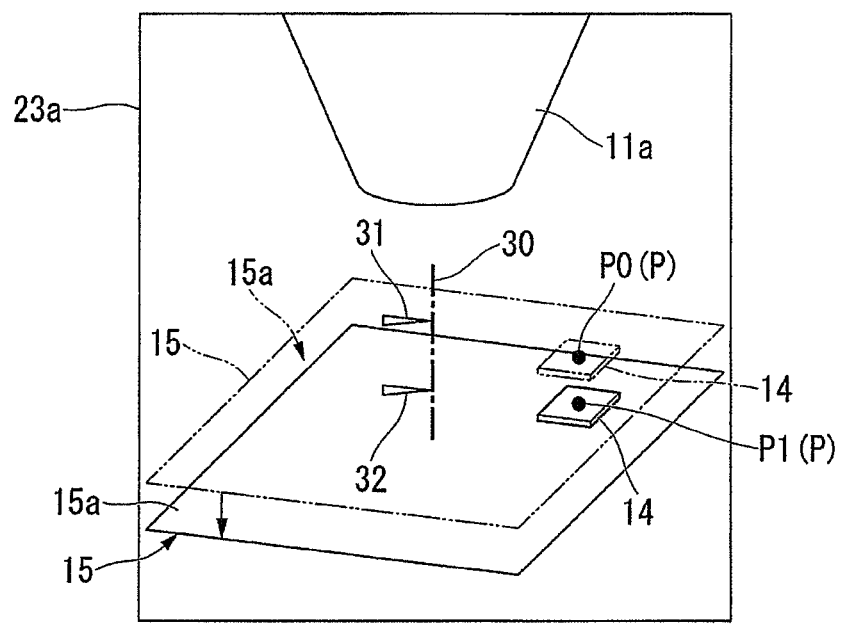
FIG. 8 is a schematic diagram showing a display screen after a step S3 is performed in FIG. 5.
Figure 9:
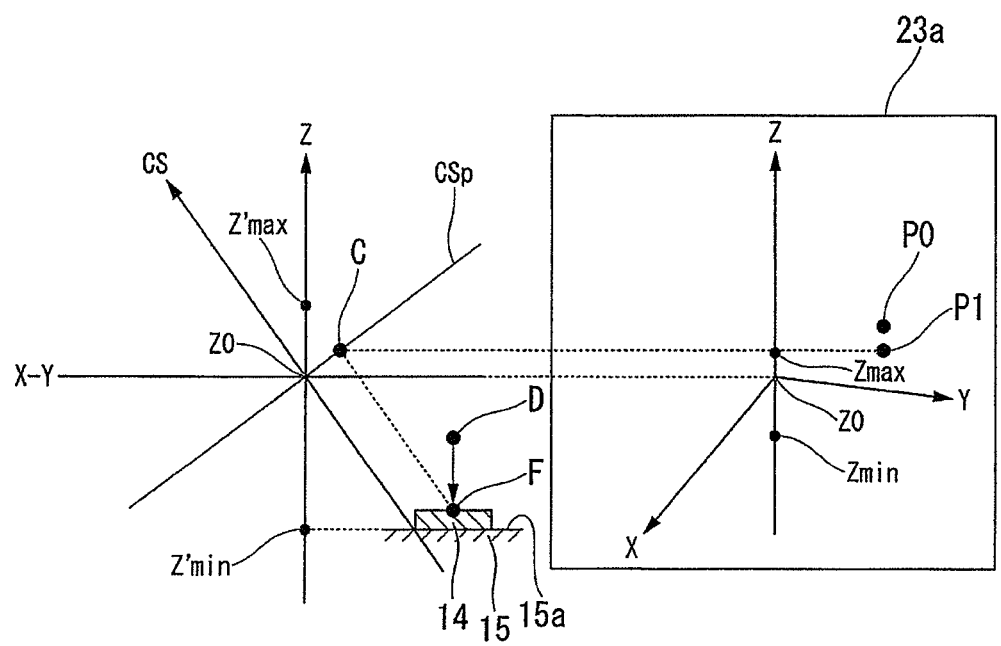
FIG. 9 is a schematic diagram showing the relationship between the position of an attention point and an XYZ coordinate system in FIG. 8.

FIG. 8 is a schematic diagram showing a display screen after a step S3 is performed in FIG. 5. FIG. 9 is a schematic diagram showing the relationship between the position of a target point and an XYZ coordinate system in FIG. 8.

The control device 18 instructs the stage control device 20 to move the bed surface 15a of the sample stage 15 parallel only in Z-axial direction such that the bed surface 15a moves to a plane parallel to the X-Y plane passing the bottom limit point Zmin.

As shown in FIG. 8, the stage control device 20 drives the Z-axial stage of the sample stage 15 and moves the bed surface 15a (down) in the negative direction of the Z axis. The bed surface 15a is positioned at a position passing the bottom limit point Zmin (see the solid line in FIG. 8).

As a result, the attention point P is moved from a point P0 to a point P1. Since the thickness of the sample 14 can be ignored, the attention point P1 is positioned in an on-axis point tracer plane formed by the bed surface 15a.

The bottom limit point mark 32 indicates the original bottom limit point Zmin, but it also indicates the bed surface 15a because the bed surface 15a is moved to the bottom limit point Zmin.

Further, referring to FIG. 8, the figures indicated by two-dot chain lines and the arrow indicating the movement direction of the sample stage 15 (the vertical arrow at the left lower corner) are provided for convenience for reference and are not actually shown in the display screen 23a (which is the same as the following same schematic diagrams).

As shown in FIG. 9, as the bed surface 15a is moved, the attention point P1 looks like continuing laterally from the top limit point Zmax in the display screen 23a. However, as shown at the left side in FIG. 9, the attention point P is actually moved from a point D to a point F and the Z-axial position of the attention point P1 is actually the same as the bottom limit point Zmin. The position of attention point P1 is never related with the position of the top limit point Zmax.

When the attention point P has been moved to attention point P1, step S3 is finished.

As shown in FIG. 5, step S4 is performed after step S3. Step S4 is a process of moving an attention point in an on-axis point tracer plane to a position on the Z axis in a display screen. In step S4, the sample stage 15 is moved by input from an operator.

Figure 10:
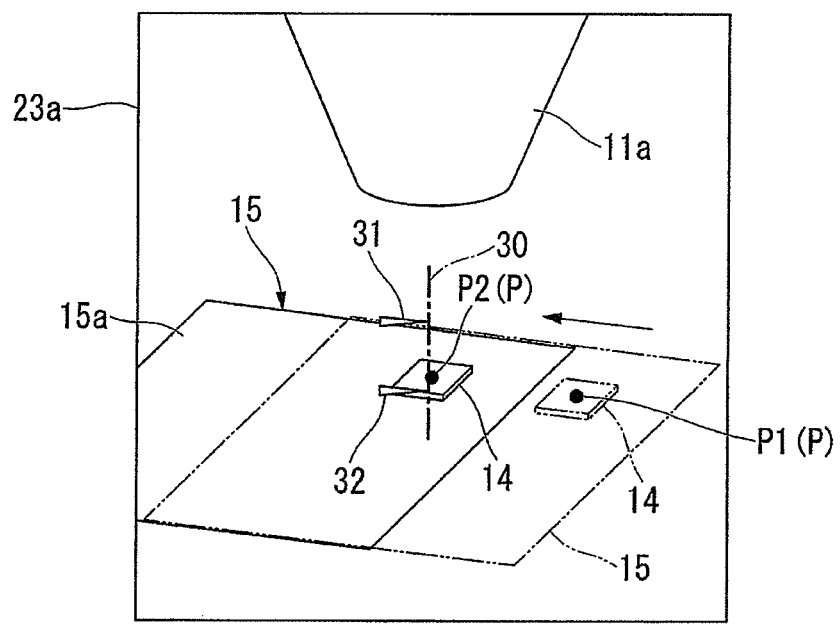
FIG. 10 is a schematic diagram showing a display screen after a step S4 is performed in FIG. 5.
Figure 11:
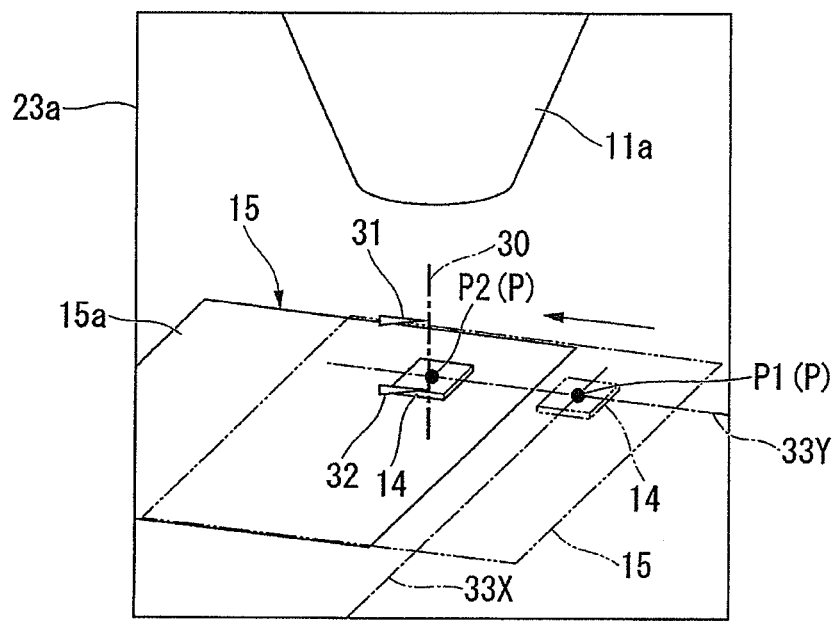
FIG. 11 is a schematic diagram showing an example of a sub-mark that can be used in the sample positioning method according to the first embodiment.

FIG. 10 is a schematic diagram showing a display screen after a step S4 is performed in FIG. 5. FIG. 11 is a schematic diagram showing the relationship between the position of a target point and an XYZ coordinate system in FIG. 10.

In step S4 and step S5 to be described below, the control device 18 may not receive input for moving the sample stage 15 in direction other than the X-axial direction and the Y-axial direction to prevent an error by the operator. In this case, when input for moving the sample stage 15 in directions other than the X-axial direction and the Y-axial direction is given, the control device 18 may show a message for urging the operator to give input for moving it in the X-axial direction or the Y-axial direction.

First, the operator moves the bed surface 15a in the X-axial direction or the Y-axial direction and moves the attention point P over the optical axis mark 30.

For example, in FIG. 10, the bed surface 15a is moved in the negative direction of Y axis and the attention point P is moved from the point P1 to an attention point P2 on the optical axis mark 30 in step S4.

The operator can determine the movement direction and amount by visually checking the difference of the current position of the attention point P from the optical axis mark 30 in the display screen 23a.

The operator can move the attention point P to a desired position on the optical axis mark 30 by moving it in the X-axial direction and the Y-axial direction. However, it is preferable to move it to the optical axis mark 30 only in any one of the X-axial direction and the Y-axial direction in order to reduce the number of work in this step.

An unskillful operator does not know well the X-axial direction and the Y-axial direction in the display screen 23a, so he/she may not easily determine the direction and distance only from the optical axis mark 30.

The control device 18 may show sub-marks showing the X-axial and Y-axial direction on the display unit 23 in this step.

FIG. 11 is a schematic diagram showing an example of a sub-mark that can be used in the method of positioning a sample according to the first embodiment.

Movement direction sub-marks 33X and 33Y (sub-marks) shown in FIG. 11 are straight linear marks passing attention point P1 and being parallel to the X-axis and Y-axis respectively in an on-axis point tracer plane.

The control device 18 calculates the coordinates of the attention point P in the display screen 23a ever time the attention point P is moved, as described above. The control device 18 creates images of the movement direction sub-marks 33X and 33Y on the basis of the coordinates and transmits the images to the display unit 23, whereby the movement direction sub-marks 33X and 33Y are shown on the CS image.

When the movement direction sub-marks 33X and 33Y are displayed, the movement direction sub-mark 33Y is close to the bottom limit point mark 32, so the operator can know that he/she has only to slightly move the movement direction sub-mark 33Y.

The movement amount is the distance between the intersection of the movement direction sub-mark 33Y and the optical axis mark 30 and the attention point P1, it can be easily estimated. The movement amount may be calculated by the control device 18 when the movement direction sub-marks 33X and 33Y are created, and then it may be and displayed with the optimal movement direction in the display screen 23a. When the movement amount is displayed, the operator can move the attention point P1 over the optical axis mark 30 by moving it once in the Y-axial direction, so quick operation is possible.

As a modification of the sub-marks, it may be possible to arrange sub-marks to make lattices by showing a plurality of movement direction sub-marks 33X and 33Y in parallel. In this case, when the gaps between the lattices are made uniform, the operator can quickly intuitively know the movement amount corresponding to a positional difference only by seeing the display screen 23a.

The sub-marks making lattices are useful for a combination of X-axial and Y-axial movement.

Figure 12:
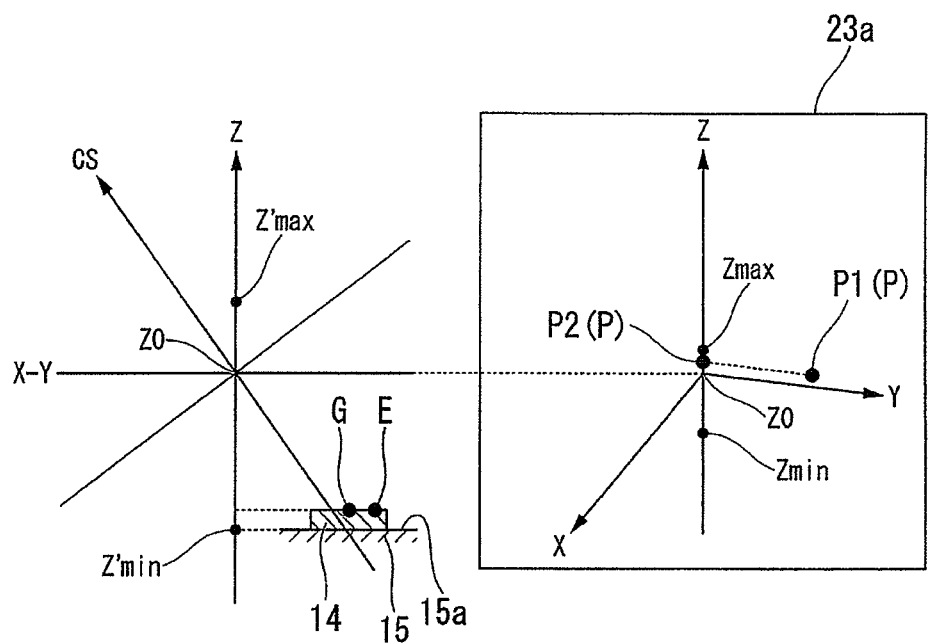
FIG. 12 is a schematic diagram showing the relationship between the position of an attention point and an XYZ coordinate system in FIG. 10.

The relationship between the position of the attention point P2 and the XYZ coordinate system is shown in FIG. 12. FIG. 12 is a schematic diagram showing the relationship between the position of an attention point and an XYZ coordinate system in FIG. 10.

As shown at the right side in FIG. 12, the attention point P2 looks like being on the Z axis in the display screen 23a. However, as shown at the left side, a point G corresponding to the attention point P2 has been moved close to the CS axis and is actually close to a point E corresponding to the attention point P1 on Z axis.

As described above, although the attention point P has been on Z axis in the display screen 23a, as long as the attention point P is deviated from the on-axis target point in the display screen 23a, it is never position on the actual Z axis.

When the attention point P1 is moved to the attention point P2, step S4 is finished.

As shown in FIG. 5, step S5 is performed after step S4. Step 5 is a process of moving an attention point to an on-axis target point in an on-axis point tracer plane. In step S5, similar to step 4, the sample stage 15 is moved by input from an operator.

Figure 13:
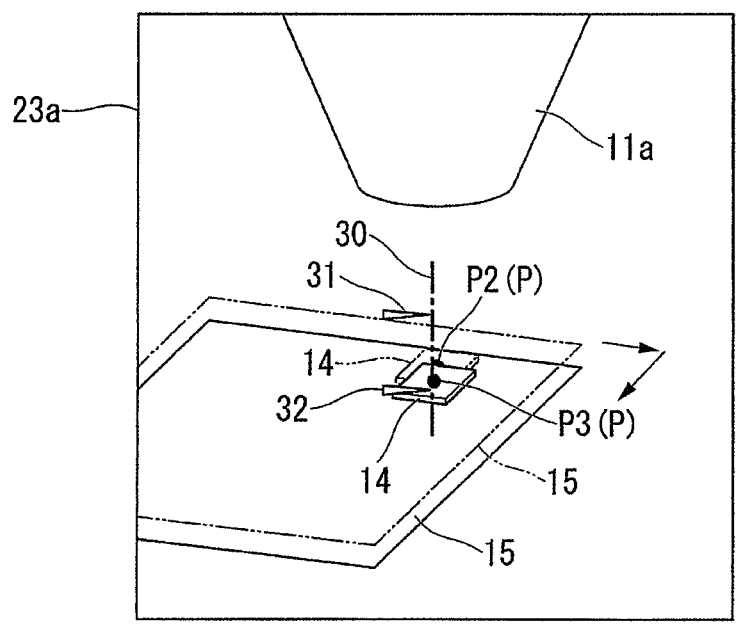
FIG. 13 is a schematic diagram showing a display screen after a step S5 is performed in FIG. 5.
Figure 14A:
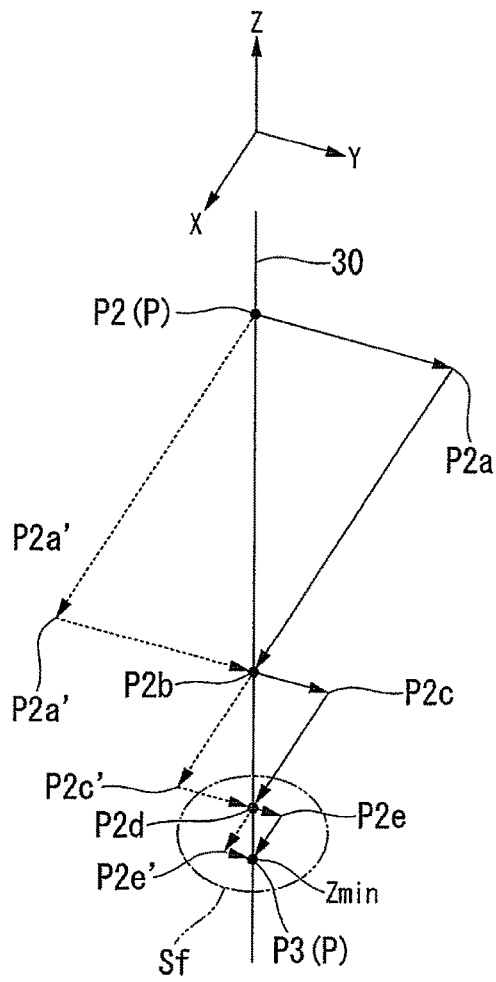
FIGS. 14A and 14B are schematic diagrams showing an example of moving an attention point in step S5.
Figure 14B:
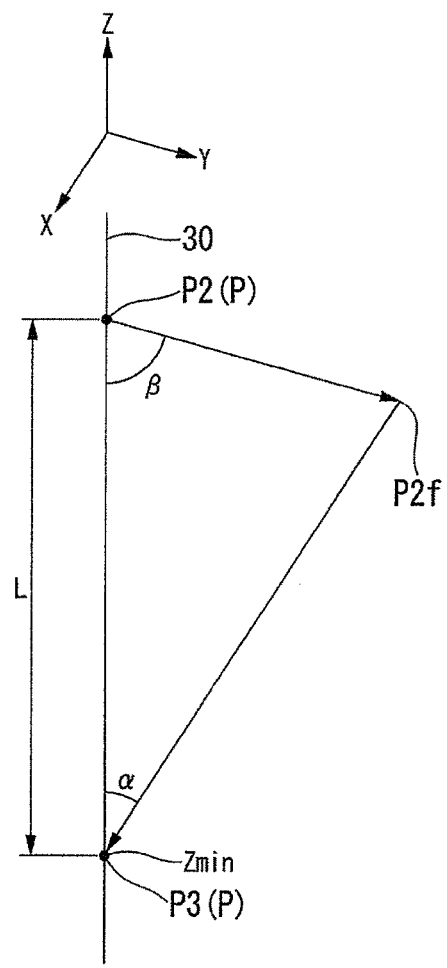

FIG. 13 is a schematic diagram showing a display screen after step S5 is performed in FIG. 5. FIGS. 14A and 14B are schematic diagrams showing an example of moving the attention point in step S5.

An operator moves the bed surface 15a in the X-axial and Y-axial directions and moves the attention point P2 to the bottom limit point Zmin that is the on-axis target point.

For example, as indicated by solid lines in FIG. 14A, an operator moves the attention point P on the optical axis mark 30 in the positive direction of the Y axis to a point P2a and in the positive direction of X axis to a point P2b on the optical axis mark 30. Since the point P2b is spaced from the bottom limit point Zmin, the attention point P is continuously moved close to the bottom limit point Zmin through points P2b, P2c, P2d, and P2e with different distances. The attention point P3 finally moved from the point P2e to the optical axis mark 30 coincides with the bottom limit point Zmin.

When this process is repeated, the attention point is continuously moved toward the optical axis mark 30, so an error that moves the attention point away from the bottom limit point Zmin can be prevented.

Movement in the positive direction of the X axis may be performed first to achieve the same result, as indicated by dotted arrow lines in FIG. 14A.

In this step, a lattice-shaped sub-mark composed of the movement direction sub-marks 33X and 33Y may be shown in the display screen 23a. In this case, the operator can easily estimate the movement amount.

When this movement is repeated, the movement amount is excessively small around the bottom limit point Zmin, so it may be impossible to accurately position the attention point P to the bottom limit point Zmin. However, the attention point P has only to be moved into the field of view of the first charged particle beam B1, so that a predetermined error is allowable. For example, when the field of view Sf is in the range shown in FIG. 14A, in the display screen 23a, movement can be stopped when the attention point P is moved into the field of view Sf. For example, the points P2d and P2e may be the attention point P3.

The control device 18 may display a figure showing the field of view Sf as a sub-mark in the display screen 23a.

As shown in FIG. 14B, movement from the attention point P2 to the bottom limit point Zmin may be achieved by one-time movement in the X-axial direction and the Y-axial direction, respectively. Since the control device 18 keeps the coordinates of the attention point P2 in the display screen 23a and the coordinates of the bottom limit point Zmin, the distance L between the attention point P2 and the bottom limit point Zmin is already known. Further, the angle α between X axis and Z axis and the angle β between Y axis and Z axis in the display screen 23a are also already known.

Accordingly, the control device 18 can calculate the coordinates of a point P2f to which the attention point P2 is moved in the display screen 23a from this information, so it can calculate the movement amount in the X-axial and Y-axial directions. The control device 18 may show the calculated movement amount in the display screen 23a. In this case, the operator can easily and quickly perform the movement in this step.

Figure 15:
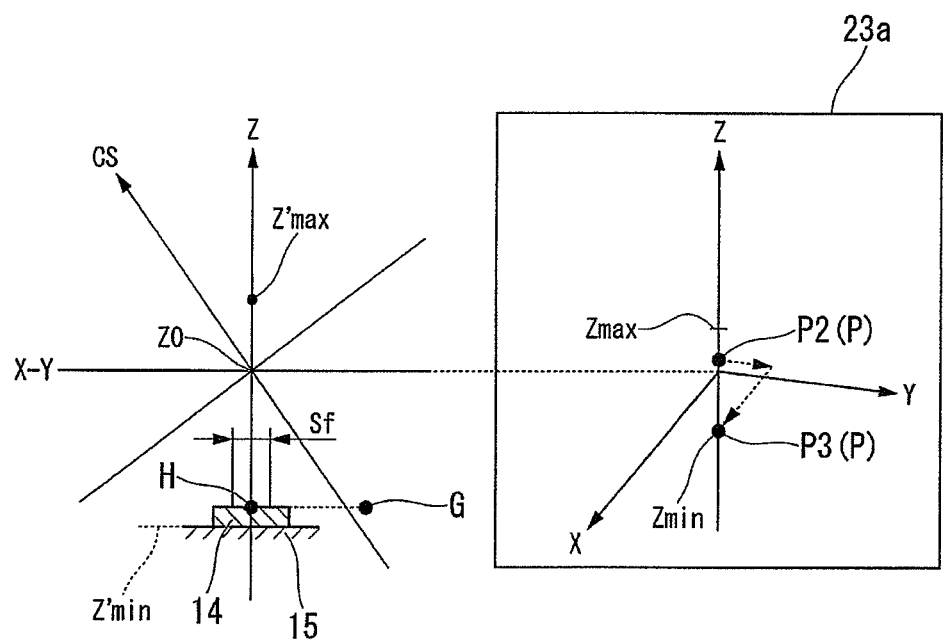
FIG. 15 is a schematic diagram showing the relationship between the position of an attention point and an XYZ coordinate system in FIG. 13.

The relationship between the position of the attention point P3 and the XYZ coordinate system is shown in FIG. 15. FIG. 15 is a schematic diagram showing the relationship between the position of an attention point and an XYZ coordinate system in FIG. 13.

As shown at the right side in FIG. 15, the attention point P3 coincides with the bottom limit point Zmin in the display screen 23a. In this case, as shown at the left side, it can be seen that a point H corresponding to the attention point P3 is on the actual Z axis. However, as described above, the point H has only to be in the field of view Sf.

Accordingly, in the sample positioning method of this embodiment, there is a tolerance depending on the field of view in the degree of coincidence of the attention point P and the on-axis target point.

Accordingly, for example, when the sample 14 is not that thick, as described above, the bottom limit point Zmin may be used as the on-axis target point.

When the attention point P3 is moved to the bottom limit point Zmin which is the on-axis target point in the display screen 23a, the operator informs the control device 18 that the attention point P has moved to the on-axis target through the input unit 22. If the control device 18 is set not to receive input for movement in directions other than the X-axial and Y-axial direction, the setting is removed. Accordingly, step S5 is finished.

As shown in FIG. 5, step S6 is performed after step S5. Step S6 is a process of moving an attention point into the depth of a focus of the charged particle beam optics along the optical axis Ob from an on-axis target point. The depth of a focus of the charged particle beam optics is a range on an optical axis in which an image that shows well a target observation area of the sample 14 as the first charge particle beam B1 is focused.

Figure 16:
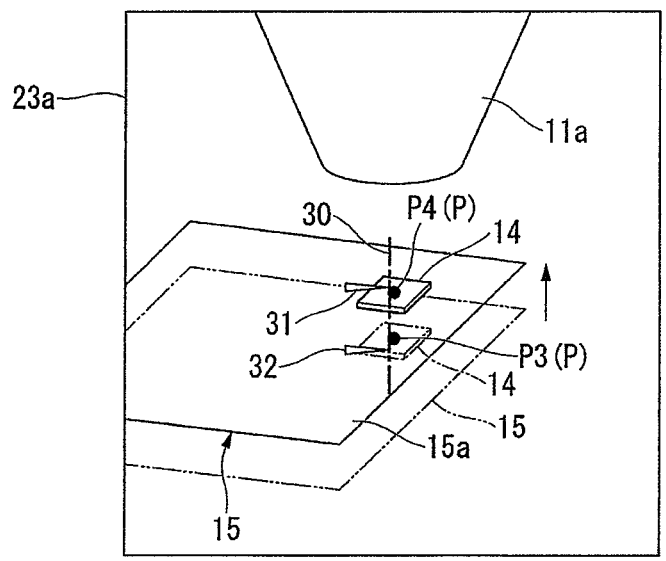
FIG. 16 is a schematic diagram showing a display screen after a step S6 is performed in FIG. 5.

FIG. 16 is a schematic diagram showing a display screen after step S6 is performed in FIG. 5.

In this step, the operator slowly moves the sample stage 15 in the positive direction of the Z axis while checking that the sample stage 15 enters the field of view by the first charged particle beam B1.

First, the operator performs input for starting to radiate the first charged particle beam B1 through the input unit 22. The observation magnification by the first charged particle beam B1 is set to the minimum to make sure that the attention point P enters the field of view of the first charged particle beam B1 even if there is an error in positioning of the attention point P. The control device 18 maximizes the scanning rage of the first charged particle beam B1 to minimize the observation magnification.

The control device 18 controls the secondary particle image generator 19 to start making an image by radiating the first charged particle beam B1. The image transmitted from the secondary particle image generator 19 to the control device 18 (hereafter, referred to as a charged particle beam image) is transmitted to the display unit 23 by the control device 18. The display unit 23 displays the charged particle beam image in the display screen 23a instead of a CS image. However, when the display unit 23 has a plurality of display screens, the charged particle beam image may be displayed in a separate specific display screen from a CS image.

As the bed surface 15a approaches the depth of a focus of the charged particle beam, the charged particle beam image become clear and a target observation area corresponding to the attention point P becomes visible in the charged particle beam image.

The operator checks whether the target observation area is in the field of view from the charged particle beam image, and when the target observation area is likely not to enter the field of view, he/she finely move the sample stage 15 in the X-axial direction or the Y-axial direction.

The operator maintain the target observation area close to the center of the field of view and finely moves the sample stage 15 in the Z-axial direction, thereby finding out the position of an overlapping focus of the target observation area.

By gradually increasing the observation magnification using the first charged particle beam B1 and adjusting the position of the sample stage 15 in the X-axial, Y-axial, and Z-axial directions, it is possible to more accurately position the target observation area to the observation center of the first charged particle beam B1.

When it is possible to find out the overlapping focus with the optimum observation magnification for observing the target observation area, the operator stops moving the sample stage 15.

Then, step S6 is finished and the sample positioning method of this embodiment is finished.

Next, a case when the sample 14 is not sufficiently thin (the height is not sufficiently low) such that the thickness cannot be ignored is described. For example, when the thickness of the sample 14 is 0.5 mm or more think and is ignored, a tolerance in positioning may not be allowed.

For example, when the widest field of view (at the lowest observation magnification) of the first charged particle beam B1 is a square of 1 mm, an allowable position difference of the attention point P should be within ±0.5 mm from the center of the field of view.

Figure 17:
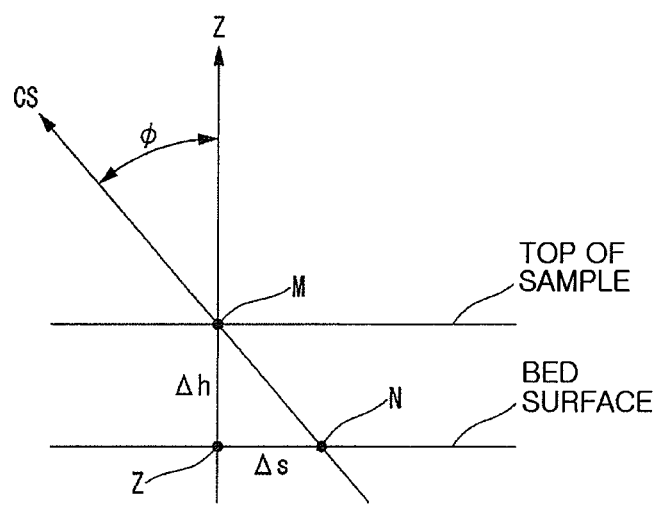
FIG. 17 is a schematic diagram illustrating a range of a sample thickness within which the sample positioning method according to the first embodiment of the present invention can be performed without considering the thickness of the sample.

FIG. 17 is a diagram illustrating an allowable sample thickness allowing a target observation area to be positioned in a field of view without considering the thickness of the sample. FIG. 17 shows a case when the attention point P is at a point M higher by $\Delta h$ than the bed surface in the Z-CS plane. That is, $\Delta h$ corresponds to the thickness of a sample. The actual XY coordinates of point M are those of point Z on the bed surface under point M, but in the CS display screen, point M looks like point N that is an intersection between an XY plane and a line extending from the CS axis. That is, it looks like moving by $\Delta s$ that is the distance between the points Z and N from the actual position. When a sample is sufficiently thin such that the thickness can be ignored, the point N coincides with the point Z, but the thicker the sample, the larger the $\Delta s$. When $\Delta s$ is $\Delta h$ that is not larger than 0.5 mm, it is possible to position the attention point into the field of view, as described above.

Referring to FIG. 17, it can be seen that $\Delta h$ satisfies $\Delta h = \Delta s / \tan \varphi$, where $\varphi$ is the angle between the optical axis of a charged particle beam and the chamber scope axis.

For example, when $\Delta s$ is 0.5 mm and $\varphi$ is 55°, the allowable sample thickness $\Delta h$ is 0.35 mm. That is, when the sample thickness is 0.35 mm or less, it is possible to move attention point P into the field of view using the method described above.

When the thickness h of the sample is not ignorable, the on-axis point tracer plane is moved parallel by h in the positive direction of Z axis from the bottom limit point Zmin so that the on-axis point tracer plane becomes the surface of the sample 14 where the attention point P is. The on-axis target point also becomes a point moved by h in the positive direction from the bottom limit point Zmin.

For example, when the operator inputs the thickness h of the sample 14 to the control device 18 through the input unit 22 before starting positioning, the control device 18 can correct the position of the bottom limit point mark 32 by h and display the corrected mark in the display screen 23a. In this case, other operations may be performed as described above.

For example, it is possible to measure the thickness of the sample 14 in advance using an optical microscope. In this case, it is not required to know the accurate height of the sample 14, and for example, an approximate value expressed in the unit of 0.5 mm is enough.

When the sample 14 is not smooth and the height of the attention point P is different from the thickness of the sample 14, it is required only to measure the height of the attention point P in advance.

However, when the thickness of the sample 14 or the height of the attention point P varies, it is required to measure or input the thickness of the sample 14 in every position, so the amount of work increases.

On the other hand, there is a predetermined tolerance in the position of the on-axis point for positioning the attention point P into the field of view, as described above.

The following modifications may be achieved from this embodiment.

The thickness hcs of the sample 14 that is shown only on a CS image is $hcs = h \sin \varphi$, where $\varphi$ is the angle between the CS axis and Z axis shown in FIG. 2, which is already known.

For example, when h is 0.5 mm and $\varphi$ is 55°, the thickness hcs when seen from the outside is about 0.4 mm. Accordingly, when a sub-mark for plate thickness which has a scale of 0.4 mm in the Z-axial direction is shown on a CS image where the sample 14 can be moved, the operator can simply measure the thickness h of the sample 14 in the unit of 0.5 mm.

Further, when the same scale is shown on the optical axis mark 30 from the bottom limit point mark 31 corresponding to the bottom limit point Zmin, the operator can select an on-axis target point within a tolerance on the basis of the thickness of the sample 14 read out form the CS image.

When the control device 18 can show the sub-mark for plate thickness and sub-marks indicating a plurality of expected on-axis target points, it is possible to quickly position the sample 14 even if the thickness of the sample 14 is frequently changed.

Further, the sub-marks indicating a plurality of expected on-axis target points may be used for indicating plate thickness.

As described above, according to the sample positioning method of this embodiment using the charged particle beam apparatus 10, it is possible to easily and quickly position a target observation area of a sample into the observation field of view of the first charged particle beam.

[Second Embodiment]

A charged particle beam apparatus according to a second embodiment of the present invention is described.

As shown in FIG. 1, a charged particle beam apparatus 40 of this embodiment automatically moves an attention point P designated by an operator into the field of view of a first charged particle beam B1.

The charged particle beam apparatus 40 includes a chamber scope 47 and a control device 48 instead of the chamber scope 17 and the control device 18 of the charged particle beam apparatus 10 of the first embodiment.

Hereafter, differences from the first embodiment are mainly described.

The chamber scope 47 is an infrared CCD camera that is operated with the inside of a sample chamber 13 shield against light.

The control device 48 has an automatic positioning mode in addition to the manual operation mode and the positioning support mode of the first embodiment, which is the difference from the control device 18.

Control by the control device 48 that is performed in the automatic positioning mode will be described in detail in relation to the operation of the charged particle beam apparatus 40.

Next, in the operation of the charged particle beam apparatus 40, the operation relating to the sample positioning method of this embodiment is mainly described.

Figure 18:
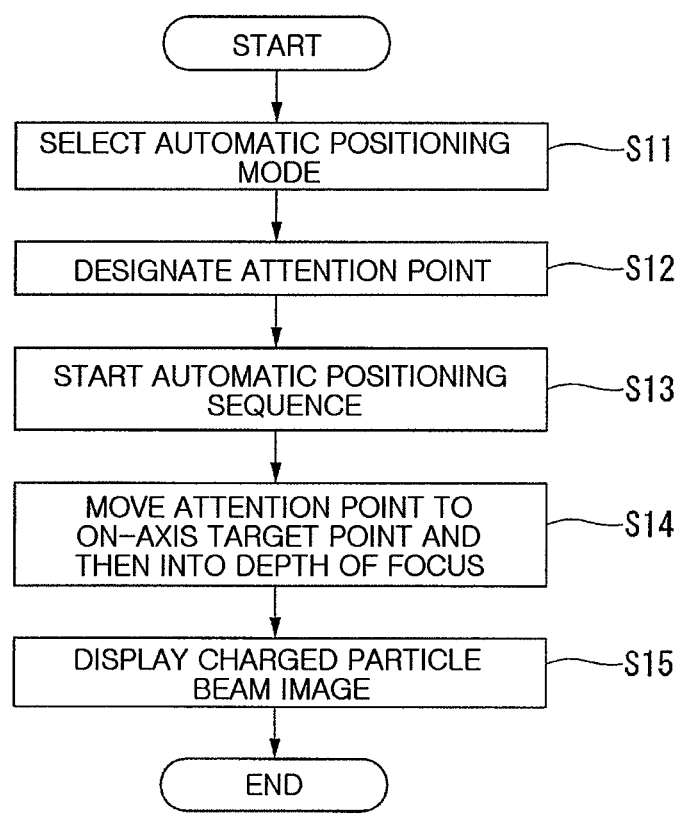
FIG. 18 is a flowchart illustrating the operation of a sample positioning method according to a second embodiment of the present invention.
Figure 19:
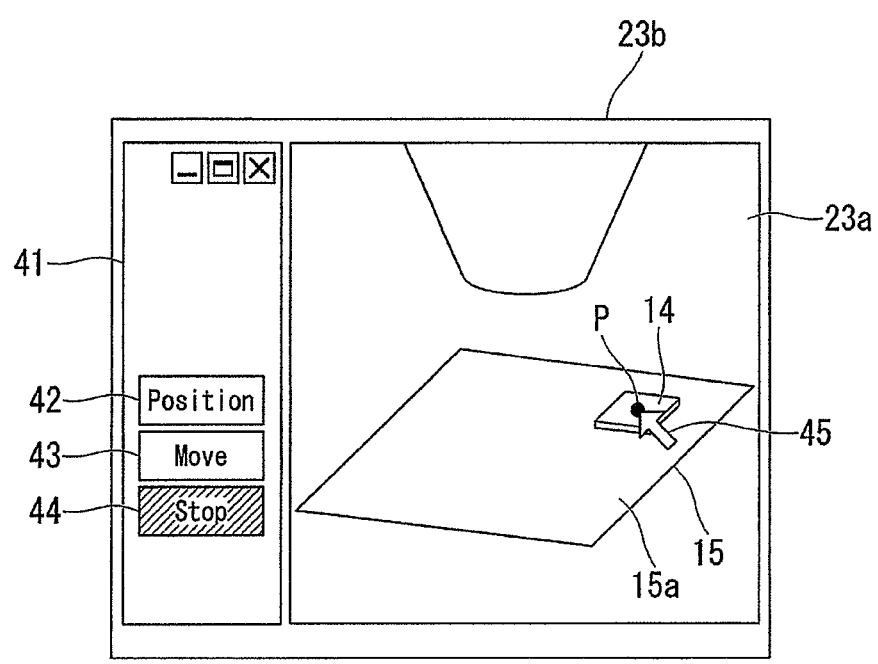
FIG. 19 is a schematic view showing an example of a display screen of a display unit of a charged particle beam apparatus according to the second embodiment of the present invention.

FIG. 18 is a flowchart illustrating the operation of a sample positioning method according to the second embodiment of the present invention. FIG. 19 is a schematic view showing an example of a display screen of a display unit of the charged particle beam apparatus according to the second embodiment of the present invention.

The control device 48, as shown in FIG. 19, displays a display screen 23a for showing a CS image and an input display screen 41 on a display unit 23, which is the same as in the first embodiment.

At least a position button 42, a sequence start button 43, and a stop button 44 are provided in the input display screen 41.

The position button 42 is provided for keeping a designated attention point in the control device 48.

The sequence start button 43 is provided for making the control device 48 start an automatic positioning sequence.

The stop button 44 is provided for making the control device 48 forcibly stop the automatic positioning sequence. The stop button 44 is used for forcibly stopping the charged particle beam apparatus 40 when an abnormal operation is generated.

The chamber scope 47, which is an infrared CCD camera, can display a CS image in the display screen 23a of the display unit 23 even if a charged particle beam is being radiated.

The sample positioning method of this embodiment performs steps S11 to S15 shown in FIG. 18 in accordance with the flow show in FIG. 18.

First, an operator performs step S11 shown in FIG. 18.

Step S11 is a process of selecting the automatic positioning mode.

The operator displays a CS image in the display screen 23a of the display unit 23, when a CS image is not displayed on the display unit 23.

The operator selects the automatic positioning mode through an input unit 22 or the input display screen (not shown) displayed on the display unit 23.

When the control device 48 is informed that the automatic positioning mode has been selected, it starts executing a control program for performing the automatic positioning mode.

Step S12 shown in FIG. 18 is performed after step S11. Step S12 is a process of designating an attention point.

The operator moves a cursor 45 through the input unit 22 and clicks the cursor 45 on an attention point in the display screen 23a, thereby designating the attention point P on the sample 14. Further, the operator presses the position button 42 in the input display screen 41, whereby the control device 48 keeps the coordinates of the attention point and the coordinates of the sample stage 15 in the display screen.

Since the attention point P is automatically moved into the field of view of the charged particle beam in the automatic positioning mode, a mark for indicating an attention point may not be shown, but it is preferable to show the mark for the operator to monitor the operation of the charged particle beam apparatus 40.

Similarly, the sub-marks described in relation to the first embodiment may not be shown, but it is preferable to shows the marks for the operator to monitor the operation of the charged particle beam apparatus 40. Further, the CS image may not be completely displayed until the movement is finished after the attention point is designated.

Even if sub-marks are not shown, similar to the control device 18 of the first embodiment, the control device 48 keeps the coordinates of the attention point P, the bottom limit point Zmin, and the reference point Z0 in the display screen 23a and the coordinates of the sample stage 15 that has being moved in three axial directions.

The coordinates of the attention point P are updated with movement of the sample stage 15.

When the operator finishes designating attention point P, step S12 is finished.

Step S13 shown in FIG. 18 is performed after step S12. Step S13 is a process of giving an instruction to start the automatic positioning sequence.

Step S13 is performed when the operator presses the sequence start button 43 shown in FIG. 19.

Step S13 is then finished.

Step S14 shown in FIG. 18 is a process of moving the sample stage 15 and moving the attention point P to an on-axis target point on the CS image and then moving it into the depth of a focus of a charged particle beam optics.

When the sequence start button 43 is pressed, this step is automatically performed by a control program for performing the automatic positioning sequence kept in the control device 48. If it is required to stop the sequence, the sequence is forcibly stopped when the operator presses the stop button 44 (see FIG. 19).

This step is performed substantially similarly to steps S3 to S6 of the first embodiment. However, the operations that are performed by instructions from an operator in the first embodiment are performed in response to control signals from the control device 48.

In this sequence, the coordinates (addresses of pixels) of a movement target position on the Z axis, the bottom limit point Zmin, and the reference point Z0 in the CS image are kept in advance in the control device 48. Accordingly, the control device 48 is set to stop or move the sample stage 15 to the next target position when the coordinates of the attention point P coincide with the coordinates of a desired target position with movement of the sample stage 15. Accordingly, the sequence is composed of a series of operations that are continuously performed.

Determining whether the attention point coincides with the desired target position is performed on the basis of whether the coordinates are completely the same, but is not limited thereto. For example, the coordinates have only to coincide within an allowable difference set for each of target position.

Operations different from those in steps S3 to S6 of the first embodiment are described hereafter.

The control device 48 performs control that is the same as that in step S3 of the first embodiment, and as shown in FIG. 8, it moves an attention point P0 in the negative direction of the Z axis and moves it with an attention point P1 to an on-axis point tracer plane.

Thereafter, as shown in FIG. 10, the control device 48, instead of the operator in step S4 of the first embodiment, moves the bed surface 15a only in the X-axial direction or the Y-axial direction and moves the attention point P1 to overlap the Z axis on the CS image, similar to the attention point P2.

The control device 48, as described in step S4 of the first embodiment, can calculate an intersection on the CS image between the Z axis and a straight light parallel to the X axis or Y axis passing the coordinates of the attention point P1 kept in the control device 48. The control device 48 may control the movement of the sample stage 15 after obtaining the movement direction and amount of the sample stage 15 by converting the distance between the intersection and the attention point P1 into a movement vector in the X-axial direction or the Y-axial direction in three-dimensional space.

As another example of the method of controlling movement by the control device 48, it may be possible to determine the movement direction without calculating the position of an end point in advance, start to move the sample stage 15, compare the coordinates of the attention point P with the coordinates of a target position (the Z axis), and then stop the sample stage 15 when it is sensed that the target position is reached.

Thereafter, as shown in FIG. 13, the control device 48, instead of the operator in step S5 of the first embodiment, moves the bed surface 15a only in the X-axial direction and the Y-axial direction and moves the attention point P2 to coincide with the bottom limit point Zmin on the CS image, similar to the attention point P3.

The control device 48 performs the operation shown in FIG. 14A or 14B instead of the operator, as described in step S5 of the first embodiment.

Thereafter, as shown in FIG. 16, the control device 48, instead of the operator in step S6 of the first embodiment, moves the bed surface 15a only in the Z-axial direction and moves the attention point P3 to a predetermined target position in the depth of a focus of the charged particle beam optics, similar to the attention point P4. For example, when the predetermined target position is the reference point Z0 on the CS image, the attention point P3 is moved to the reference point Z0. When it is sensed that the attention point P3 has reached the target position in the depth of a focus, the control device 48 stops the sample stage 15.

Then, step S14 is finished.

In this embodiment, the control device 48 determines whether the attention point P has reached target positions using the coordinates of the attention point P. Accordingly, the precision of positioning an attention point to target positions is higher than the accuracy of visually positioning an attention point to target positions using sub-marks in the first embodiment. As a result, in this step, it is possible to position the attention point into a field of view even without finely adjusting the attention point P in the X-axial and Y-axial directions.

Step S15 is performed after step S14. Step S15 is a process of displaying a charged particle beam image on the display unit 23.

The control device 48 transmits a control signal to the charged particle beam column 11 and starts radiating the first charged particle beam. The control device 48 sets the observation magnification by the first charged particle beam B1 to the minimum to make sure that the attention point P enters the field of view by the first charged particle beam B1 even if there is an error in positioning of the attention point P.

The control device 48 controls the secondary particle image generator 19 to start making an image by radiating the first charged particle beam B1. The charged particle beam image transmitted from the secondary particle image generator 19 to the control device 48 is transmitted to the display unit 23 by the control device 48.

In this embodiment, since the chamber scope 47 is an infrared CCD camera, the chamber scope 47 can keep capturing images even if a charged particle beam is being radiated.

The display unit 23 displays the charged particle beam image in the display screen 23a instead of a CS image. However, when the display unit 23 has a plurality of display screens, the control device 48 can display both of a CS image and a charged particle beam image on the display unit 23.

When an operator checks the charged particle beam on the display unit 23 and it is found out that the attention point P is in the field of view, step S15 and the image positioning method of this embodiment are finished. Further, it may be possible to finish the image positioning method of this embodiment after moving the attention point P to the center of the image.

When the attention point P is deviated from the center of the field of view or the image of the attention point becomes unclear, the operator finely adjusts the sample stage 15 and then finishes step S15.

For example, when the control device 48 is given a function of recognizing a charged particle beam image to be able to detect the position of the attention point P on a charged particle beam image, the control device 48 may control the fine adjustment of the position of the attention point P. In this case, according to this embodiment, it is possible to simultaneously obtain the CS image and the charged particle beam image, so it is possible to sequentially position the attention point P on the CS image and the charged particle beam image. Accordingly, positioning can be accurately and quickly achieved. Further, a load on the operator is reduced.

As described above, according to the sample positioning method of this embodiment using the charged particle beam apparatus 40, similar to the first embodiment, it is possible to easily and quickly position a target observation area of a sample into the observation field of view of the first charged particle beam.

Further, according to the charged particle beam apparatus 40 of this embodiment, since moving the attention point P using the sample stage 15 can be automatically performed by the control device 48, positioning can be more easily and quickly achieved.

[Third Embodiment]

A charged particle beam apparatus according to a third embodiment of the present invention is described.

Figure 20:
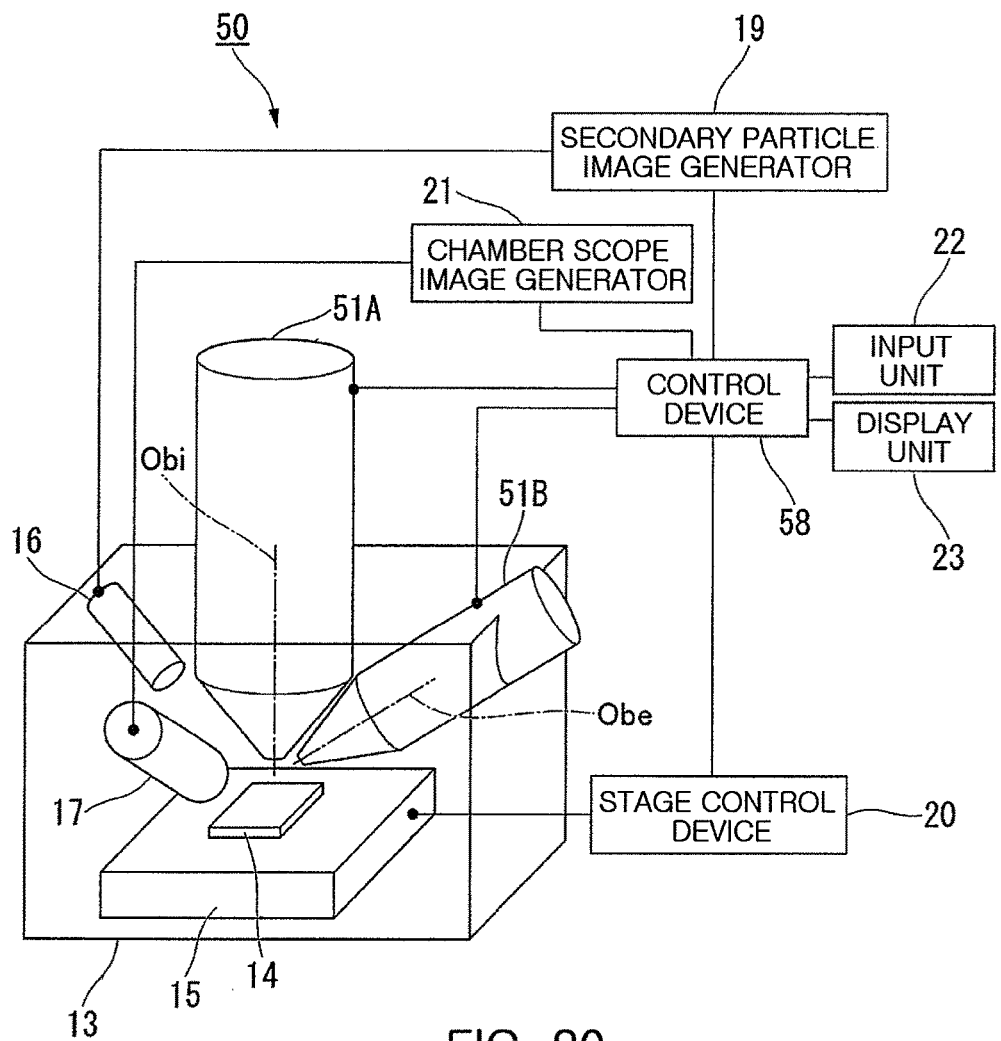
FIG. 20 is a schematic diagram showing the configuration of a charged particle beam apparatus according to a third embodiment of the present invention.

FIG. 20 is a schematic diagram showing the configuration of a charged particle beam apparatus according to the third embodiment of the present invention.

Figure 21:
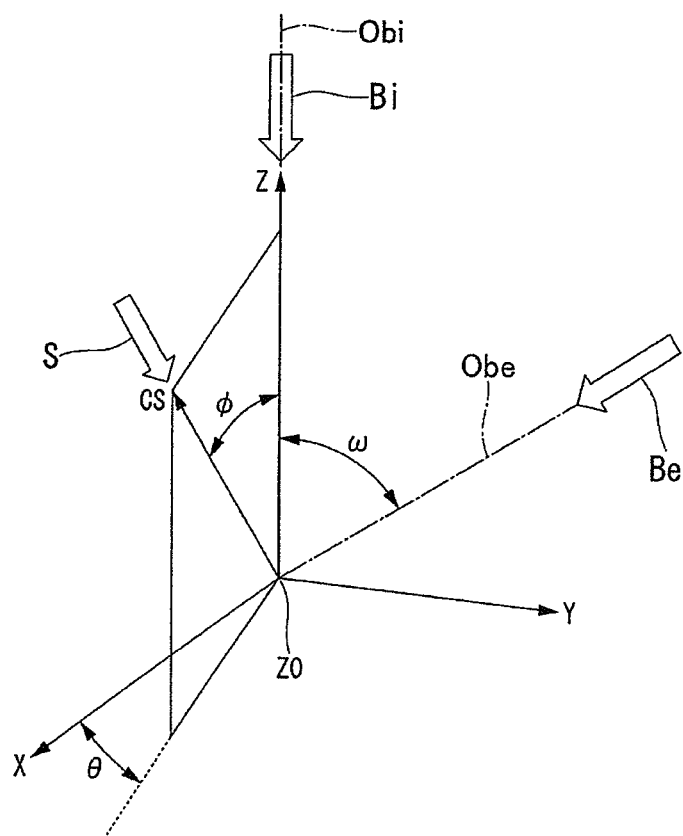
FIG. 21 is a schematic diagram showing a coordinate system in the charged particle beam apparatus according to the third embodiment of the present invention.

The charged particle beam apparatus 50 of this embodiment shown in FIG. 20 is an example of an apparatus that can radiate a charged particle beam in two directions, and in detail, the apparatus can radiate a focused ion beam and an electron beam to almost the same part on the surface of a sample. FIG. 21 is a schematic diagram showing a coordinate system in the charged particle beam apparatus according to the third embodiment of the present invention.

The charged particle beam apparatus 50 includes a focused ion beam column 51A (first charged particle beam column), an electron beam column 51B (secondary charged particle beam column), and a control device 58, instead of the charged particle beam column 11 and the control device 18 of the charged particle beam apparatus in the first embodiment.

Hereafter, differences from the first embodiment are mainly described.

The focused ion beam column 51A generates a focused ion beam Bi (see FIG. 21, first charged particle beam) and radiates the focused ion beam B1 to a sample 14 on a sample stage 15.

The focused ion beam column 51A has an ion beam optics (charged particle beam optics) having an ion source for generating the focused ion beam Bi, a lens electrode for focusing an ion beam, and a deflection electrode for defecting ions. However, the internal structure well known in the art is not shown in FIG. 20.

As shown in FIG. 21, an optical axis Obi of the ion beam optics of the focused ion beam column 51A, similar to the charged particle beam column 11 of the first embodiment, overlaps the Z axis in the XYZ coordinate system in a sample chamber 13.

The positional relationship between the focused ion beam column 51A and a chamber scope 17 is the same as the positional relationship between the charged particle beam column 11 and the chamber scope 17 in the first embodiment.

The electron beam column 51B generates an electron beam Be (see FIG. 21, secondary charged particle beam) and radiates the electron beam Be to the sample 14 on the sample stage 15.

The electron beam column 51B has an electron beam optics including an electron source for generating the electron beam Be, a lens electrode for focusing electrons, and a deflection electrode for deflecting electrons. However, the internal structure well known in the art is not shown in FIG. 20.

As shown in FIG. 21, an optical axis Obe of the electron beam optics of the electron beam column 51B is inclined at an angle ω from the Z axis to the Y axis in a Y-Z plane. Accordingly, the optical axis Obe is perpendicular to the X axis.

As described, the focus position of the ion beam optics and the focus position of the electron beam optics both coincide with a reference point Z0. Accordingly, the charged particle beam apparatus 50 can perform at least any one of observing and processing almost the same part of the sample 14 in two different directions. For example, using the charged particle beam apparatus 50, it is possible to expose a cross-section of the sample 14 by radiating the focused ion beam Bi and to find out the shape of the cross-section or element distribution on the cross-section by radiating the electron beam Be.

The control device 58 controls operations of the parts of the charged particle beam apparatus 50. Accordingly, the control device 58 is connected with the focused ion beam column 51A, the electron beam column 51B, the sample stage 15, the chamber scope 17, a chamber scope image generator 21, a secondary particle image generator 19, an input unit 22, and a display unit 23 to be able to communicate with them.

Other than the functions for controlling the operation of the focused ion beam column 51A and the electron beam column 51B, the control device 58 has functions substantially the same as those of the control device 18 in the first embodiment.

Controlling the image positioning method of this embodiment by the control device 58 will be described in relation to the operation of the charged particle beam apparatus 50.

Next, in the operation of the charged particle beam apparatus 50, the operation relating to the sample positioning method of this embodiment is mainly described.

Figure 22:
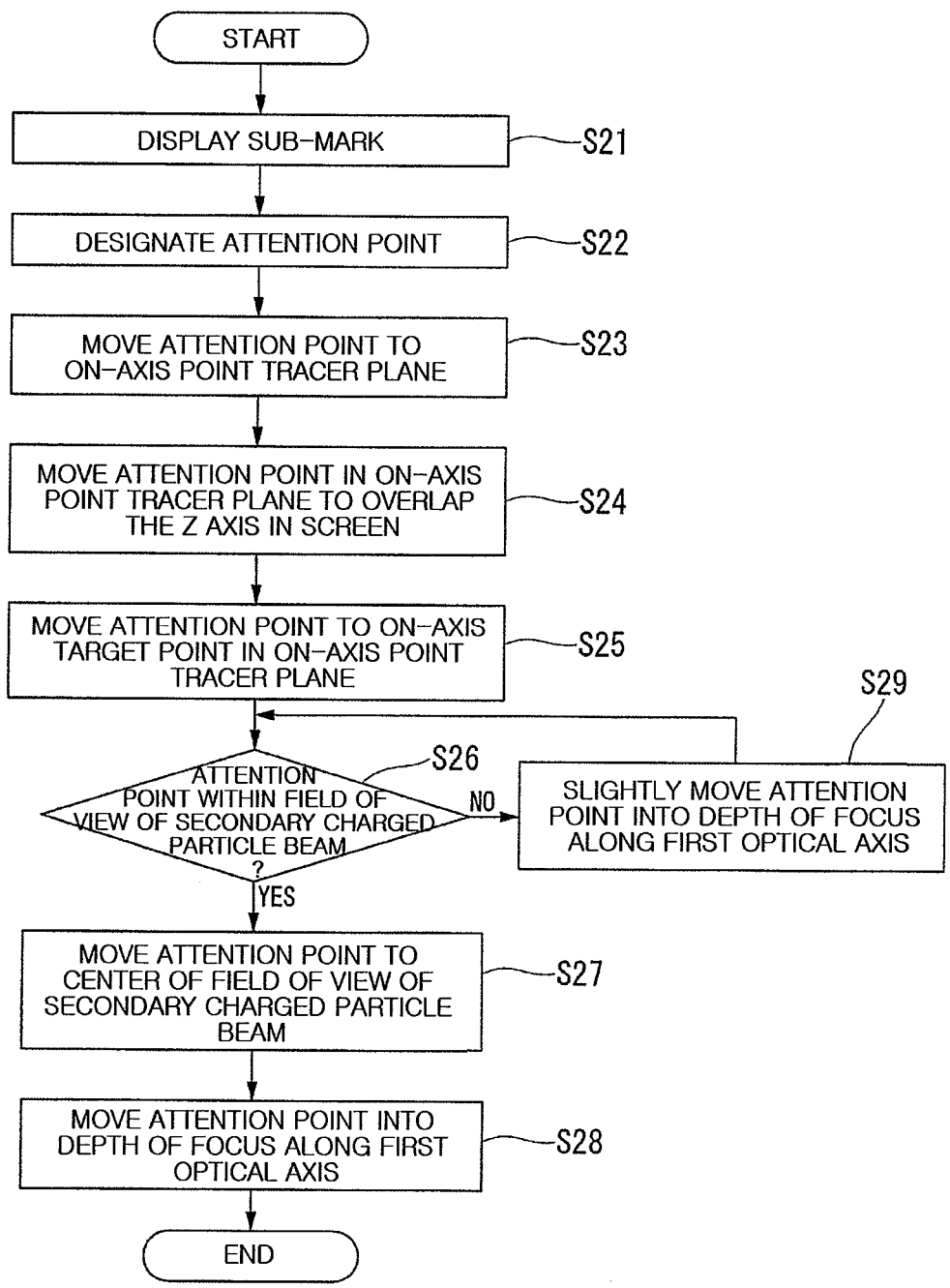
FIG. 22 is a flowchart illustrating the operation of a sample positioning method according to the third embodiment of the present invention.

FIG. 22 is a flowchart illustrating the operation of a sample positioning method according to the third embodiment of the present invention.

Since the charged particle beam apparatus 50 radiates the focused ion beam Bi and the electron beam Be to the sample 14, a target observation area of the sample 14 needs to be moved to a coincident point where the focus positions coincide. It is not easy to quickly move a target observation area of the sample 14, which is not in the field of views of the beams, to the coincident point, and doing so depends on the operator's experience in most cases.

The sample positioning method of this embodiment performs steps S21 to S29 shown in FIG. 22 in accordance with the flow show in FIG. 22.

Hereafter, different operations from the first embodiment are mainly described.

Steps S21 to S25 are the same as steps S1 to S5 shown in FIG. 1, except for using the focused ion beam column 51A instead of the charged particle beam column 11 in the first embodiment.

Accordingly, an attention point P coincides with the bottom limit point Zmin after step S25 is finished.

Step S26 is performed after step S25. Step S26 is a process of determining whether there is an attention point within the field of view of the electron beam Be that is a secondary charged particle beam.

Until this step is performed, the control device 58 controls the secondary particle image generator 19 to obtain an image by the electron beam Be (hereafter, referred to as an electron beam image) by controlling the electron beam column 51B to radiate the electron beam Be. The control device 58 displays the obtained electron beam image on the display unit 23.

An operator determines whether there is an attention point as a target observation area corresponding to the attention point on a CS image, within the field of view by checking the electron beam image.

When there is no attention point, step S29 is started.
When there is an attention point, step S27 is started.

Step S29 is a process of slightly moving the attention point P into the depth of a focus along the optical axis Obi. In detail, the bed surface 15a is moved in the positive direction of the Z axis as much as a movement amount determined and kept in the control device 58 in advance.

The reason is that the optical axis Obe of the electron beam Be is inclined at the angle ω from the Z axis, so the attention point P has difficulty in entering the field of view unless the attention point P comes close to the depth of a focus when being moved along the optical axis Obi (the Z axis).

When the bed surface 15a is moved up by a predetermined amount by the control device 58, step S26 is started.

Even though the bed surface 15a is moved in the Z-axial direction in step S29, the attention point P is positioned on the optical axis Obi up to step S25, so the attention P never comes out of the field of view of the focused ion beam Bi.

Step S26 is a process of moving an attention point to the center of the field of view of the electron beam Be.

During this step, the attention point keeps being in the field of view of the electron beam Be. Accordingly, the operator can adjust the position of the attention point within the field of view while seeing the electron beam image on the display unit 23.

The operator performs input through the input unit 22 to move the attention point to the center (corresponding to the Y-Z plane) of the field of view of the electron beam Be.

The operator checks the electron beam, and if the attention point is largely deviated from the Z-Y plane, the operator moves the sample stage 15 only in the X-axial direction to coincide with the Z-Y plane.

When the attention point is moved to the center of the field of view of the electron beam Be, step S27 is finished and step S28 is started.

By performing step S27, it becomes easy to determine the gap, which is difficult to find out on the CS image, between the target observation area corresponding to the attention point P and the Z axis in the X-axial direction. Accordingly, as in the first embodiment, it is possible to more accurately and quickly make the attention point P coincide with the Z axis in a three-dimensional space, as compared with an apparatus having only one charged particle beam column.

Step S28 is performed after step S27. Step S28 is a process of moving an attention point to a coincident point within the depth of a focus of the ion beam optics along the optical axis Obi (the Z axis).

The operator moves the attention point P to the coincident point by performing input through the input unit 22 so that the sample stage 15 is moved to the coincident point.

Then, step S28 is finished and the sample positioning method of this embodiment is finished.

As described above, according to the sample positioning method of this embodiment using the charged particle beam apparatus 50, it is possible to easily and quickly position a target observation area of a sample into the observation field of view of the first charged particle beam.

In particular, since an image in the direction intersecting the Z-CS plane is obtained by radiating the electron beam Be in this embodiment, it is possible to more precisely position the attention point P.

Further, since the attention point P is positioned within the field of view of the electron beam Be in the process of obtaining an image using the electron beam Be, it is possible to make sure of positioning the attention point to the coincident point.

Further, although sub-masks are displayed in the first embodiment, the sub-marks may be appropriately displayed when positioning is supported.

Although embodiments of the present invention were described above, the present invention is not limited to the embodiments and other modifications. The configurations of the present invention may be added, removed, replaced, and changed without departing from the scope of the present invention.

Further, the present invention is not limited to the embodiments described above, but limited only by claims.

What is claimed is:

1. A sample positioning method of positioning a target observation area of a sample, which is disposed on a sample stage in a sample chamber of a charged particle beam apparatus, into a field of view of a first charged particle beam radiated from a charged particle beam optical optics installed in a first charged particle beam column, the method including:
    displaying an image of inside of the sample chamber including the sample on the sample stage therein on a display screen of a display unit;
    designating an attention point on the target observation area on the basis of the image on the display screen, wherein the attention point moves along with the sample stage so as to maintain the relative position of the attention point with respect to the sample stage by calculating the coordinates of the attention point on the display after movement of the sample stage and displaying the attention point after movement of the sample stage;
    aligning the sample stage in a direction of a first optical axis so that the attention point is positioned on an on-axis point tracer plane perpendicular to the first optical axis through an on-axis target point on the first optical axis of the first charged particle beam column;
    after positioning the attention point on the on-axis point tracer plane, performing detection of deviation of the attention point from the on-axis target point on the display screen and movement of the sample stage within the on-axis point tracer plane only in a direction perpendicular to the first optical axis, and moving the attention point to the on-axis target point; and
    after moving the attention point to the on-axis target point, moving the attention point within the depth of focus of the charged particle beam optical optics by moving the sample stage along the first optical axis.

2. The method of claim 1, further including displaying sub-markers indicating the position of the on-axis target point and a position of the first optical axis on the display screen at least when moving the attention point to the on-axis target point to assist the movement of the attention point.

3. A charged particle beam apparatus including:
    a first charged particle beam column having a charged particle beam optical optics and radiating a first charged particle beam using the charged particle beam optical optics;
    a sample stage on which a sample is placed and which is movable at least along the direction of a first optical axis of the first charged particle beam column and in a direction perpendicular to the first optical axis;
    a sample chamber with the sample stage therein;
    a chamber scope capturing an image of an inside of the sample chamber including the sample on the sample stage;
    a display unit displaying the image captured by the chamber scope;
    an attention point position control device receiving input for designating an attention point on the image displayed on the display screen, and obtaining information about a position on the display screen of the attention point accompanying movement of the sample stage, wherein the attention point moves along with the sample stage so as to maintain the relative position of the attention point with respect to the sample stage by calculating the coordinates of the attention point on the display after movement of the sample stage and displaying the attention point after movement of the sample stage;
    a sample stage movement control device performing stage-positioning control for aligning the sample stage along a direction of a first optical axis of the first charged particle beam column so that the attention point is positioned on an on-axis point tracer plane perpendicular to the first optical axis through an on-axis target point on the first optical axis, movement control within an on-axis point tracer plane for moving the sample stage only in a direction perpendicular to the first optical axis, and on-axis movement control for moving the attention point within the depth of focus of the charged particle beam optical optics by moving the sample stage along the first optical axis;

a sub-marker display control device displaying a sub-marker indicating a position of the on-axis target point and a sub-marker indicating a position of the first optical axis; and a stage operator inputting operation instructions for the sample stage movement control device.

4. The apparatus of claim 3, further including:

a secondary charged particle beam column radiating a secondary charged particle beam along a second optical axis intersecting the first optical axis of the first charged particle beam column and intersecting a capturing direction of the chamber scope; and an image generator, capturing an image of the sample by radiating the secondary charged particle beam to the sample, wherein the sample stage movement control device can perform movement control within the field of view for adjusting a position of the attention point within a field of view of the secondary charged particle beam column during the on-axis movement control.

5. A charged particle beam apparatus including:

a first charged particle beam column having a charged particle beam optical optics and radiating a first charged particle beam using the charged particle beam optical optics;

a sample stage on which a sample is placed and which is movable at least along the direction of a first optical axis of the first charged particle beam column and in a direction perpendicular to the first optical axis;

a sample chamber placing the sample stage therein;

a chamber scope capturing an image of an inside of the sample chamber including the sample on the sample stage;

a display unit displaying the image captured by the chamber scope;

an attention point position control device receiving input for designating an attention point on the image displayed on the display screen, and obtaining information about a position on the display screen of the attention point accompanying movement of the sample stage, wherein the attention point moves along with the sample stage so as to maintain the relative position of the attention point with respect to the sample stage by calculating the coordinates of the attention point on the display after movement of the sample stage and displaying the attention point after movement of the sample stage;

a sample stage movement control device performing stage-positioning control for aligning the sample stage along a direction of a first optical axis of the first charged particle beam column so that the attention point is positioned on an on-axis point tracer plane perpendicular to the first optical axis through an on-axis target point on the first optical axis, movement control within an on-axis point tracer plane for moving the sample stage only in a direction perpendicular to the first optical axis, and on-axis movement control for moving the attention point within the depth of focus of the charged particle beam optical optics by moving the sample stage along the first optical axis; and a positioning control device which, after making the sample stage movement control device perform the stage positioning control, moves the attention point to the on-axis target point by making the sample stage movement control device perform the movement control within an on-axis point tracer plane on the basis of deviation of the attention point from the on-axis target point on the display screen, and makes the sample stage movement control device perform the on-axis movement control after the attention point is moved to the on-axis target point.

6. The apparatus of claim 5, further including:

a secondary charged particle beam column radiating a secondary charged particle beam along a second optical axis intersecting the first optical axis of the first charged particle beam column and intersecting a capturing direction of the chamber scope; and an image generator, capturing an image of the sample by radiating the secondary charged particle beam to the sample, wherein the sample stage movement control device can perform movement control within the field of view for adjusting a position of the attention point within a field of view of the secondary charged particle beam column during the on-axis movement control.

* * * * *